United States Patent [19]
Kajimoto et al.

[11] Patent Number: 5,659,260
[45] Date of Patent: Aug. 19, 1997

[54] SENSE AMPLIFIER HAVING A CIRCUIT FOR COMPENSATING FOR POTENTIAL VOLTAGE DROPS CAUSED BY PARASITIC INTERCONNECTIONS

[75] Inventors: Takeshi Kajimoto; Hiroshi Akamatsu, both of Hyogo, Japan

[73] Assignee: Mitsubishi Denki Kabushiki Kaisha, Tokyo, Japan

[21] Appl. No.: 602,521

[22] Filed: Feb. 20, 1996

Related U.S. Application Data

[62] Division of Ser. No. 286,219, Aug. 5, 1994, Pat. No. 5,539,353.

[30] Foreign Application Priority Data

Aug. 6, 1993 [JP] Japan .................... 5-195997

[51] Int. Cl.$^6$ .................................................. G01R 19/00
[52] U.S. Cl. .............................. 327/55; 327/54; 365/207
[58] Field of Search ............................. 365/207, 205; 327/227, 228, 229, 230, 51, 54, 55, 57

[56] References Cited

U.S. PATENT DOCUMENTS

| | | | |
|---|---|---|---|
| 3,975,648 | 8/1976 | Tobey, Jr. et al. | 327/543 |
| 4,122,549 | 10/1978 | Kinoshita | 327/57 |
| 4,484,331 | 11/1984 | Miller | 327/540 |
| 4,528,482 | 7/1985 | Merlo | 315/291 |
| 4,677,369 | 6/1987 | Bowers et al. | 327/535 |
| 4,820,937 | 4/1989 | Hsieh | 327/541 |
| 4,910,713 | 3/1990 | Madden et al. | 327/52 |
| 5,270,585 | 12/1993 | Tisinger | 327/227 |
| 5,272,395 | 12/1993 | Vincelette | 327/51 |
| 5,498,989 | 3/1996 | Diba | 327/230 |
| 5,525,919 | 6/1996 | Phelan | 327/52 |

FOREIGN PATENT DOCUMENTS

| | | |
|---|---|---|
| 60-157616 | 8/1985 | Japan . |
| 63-104115 | 5/1988 | Japan . |

OTHER PUBLICATIONS

Nikkei Micro Device, "Power Supply Voltage-Down Circuit," Feb. 1990, pp. 115–122.

Primary Examiner—Timothy P. Callahan
Assistant Examiner—Jung Ho Kim
Attorney, Agent, or Firm—Lowe, Price, LeBlanc & Becker

[57] ABSTRACT

A negative power supply circuit is connected via an NMOS transistor to a node receiving ground potential in a sense amplifier. A one shot pulse generation circuit provides a one shot pulse signal to the gate of the NMOS transistor. The NMOS transistor is turned on when a one shot pulse signal is applied to connect the negative power supply circuit to the node. This causes the potential of the node to be lowered to a negative potential. As a result, increase in the potential at the ground side of the sense amplifier caused by an interconnection resistance in the ground interconnection is suppressed. Therefore, variation in the potential received by the sense amplifier due to interconnection resistance can be suppressed.

2 Claims, 18 Drawing Sheets

FIG. 4(a) /RAS 
FIG. 4(b) WL 
FIG. 4(c) ∅3 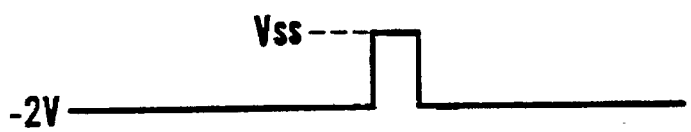
FIG. 4(d) ∅4 
FIG. 4(e) ∅1 
FIG. 4(f) ∅2 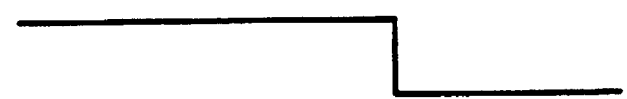
FIG. 4(g) N3 
FIG. 4(h) N4 
FIG. 4(i) BL1,/BL1 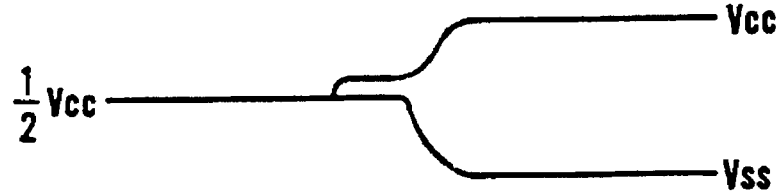

FIG. 6(a)    /RAS    
FIG. 6(b)    WL    
FIG. 6(c)    ø5    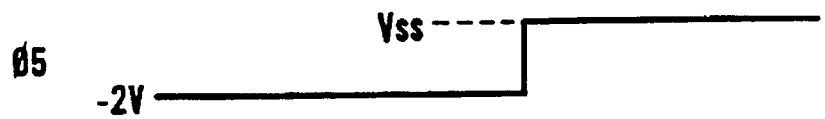
FIG. 6(d)    ø6    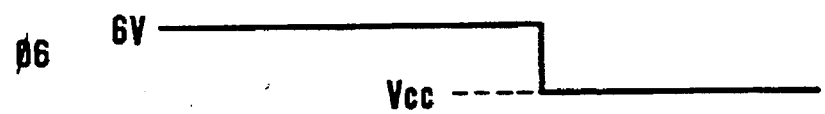
FIG. 6(e)    N3    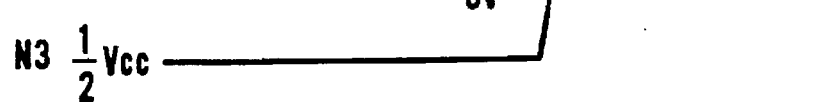
FIG. 6(f)    N4    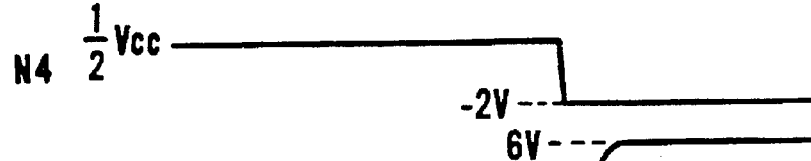
FIG. 6(g)    BL1,/BL1    

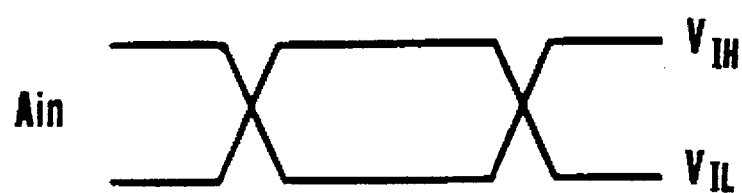
FIG. 16(a)    Ain
FIG. 16(b)    CAI
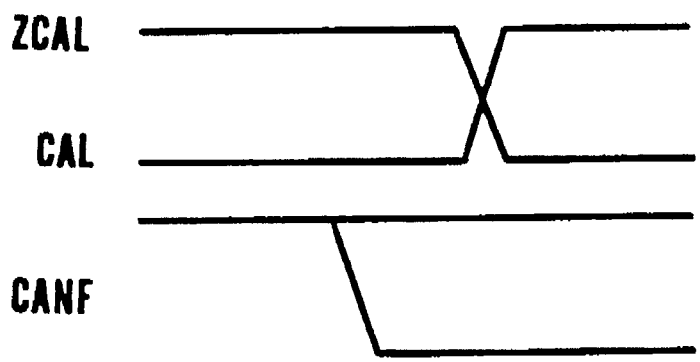
FIG. 16(c)    ZCAL / CAL
FIG. 16(d)    CANF

SENSE AMPLIFIER HAVING A CIRCUIT FOR COMPENSATING FOR POTENTIAL VOLTAGE DROPS CAUSED BY PARASITIC INTERCONNECTIONS

This application is a division of application Ser. No. 08/286,219 filed Aug. 5, 1994, U.S. Pat. No. 5,539,353.

BACKGROUND OF THE INVENTION

1. Field of the Invention

The present invention relates to semiconductor circuit devices, and more particularly, to a semiconductor circuit device including a load circuit such as a sense amplifier.

2. Description of the Background Art

A typical example of a semiconductor circuit device is a semiconductor memory device. A semiconductor memory device includes various types of load circuits. A load circuit is supplied with power supply potential and ground potential via power supply interconnection and ground interconnection, respectively.

FIG. 17 is a block diagram schematically showing connection of a load circuit. Referring to FIG. 17, a power supply node N1 receives power supply potential $V_{CC}$. A ground node N2 receives ground potential $V_{SS}$. Power supply potential $V_{CC}$ is provided from power supply node N1 to a load circuit 5 via a power supply interconnection L1. Also, ground potential $V_{SS}$ is provided from ground node N2 to load circuit 5 via a ground interconnection L2. A parasitic interconnection resistance R1 exists in power supply interconnection L1. A parasitic interconnection resistance R2 exists in ground interconnection L2.

In the operation of load circuit 5 connected in the above-described manner, load current I1 flows from power supply node N1 to load circuit 5 via power supply interconnection L1, and load current I2 flows from load circuit 5 to ground node N2 via ground interconnection L2.

A sense amplifier for amplifying a signal is exemplary of such a load circuit. FIG. 18 is a circuit diagram of a semiconductor circuit forming a conventional sense amplifier circuit. Referring to FIG. 18, two sense amplifiers SA1 and SA2 are shown using a common power source as an example of a sense amplifier circuit.

Sense amplifier SA1 functions to amplify the potential difference between a pair of bit lines BL1 and /BL1. Sense amplifier SA2 functions to amplify the potential difference between a pair of bit lines BL2 and /BL2. Sense amplifiers SA1 and SA2 are provided between power supply node N1 receiving power supply potential $V_{CC}$ and ground node N2 receiving ground potential $V_{SS}$.

Sense amplifier SA1 includes PMOS transistors Q1, Q2 and Q5, and NMOS transistors Q3, Q4, and Q6.

Transistors Q1 and Q2 have their sources connected to each other. Transistor Q1 has its drain and transistor Q2 has its gate connected to bit line BL1. Transistor Q1 has its gate and transistor Q2 has its drain connected to bit line /BL1.

Transistors Q3 and Q4 have their sources connected to each other. Transistor Q3 has its drain and transistor Q4 has its gate connected to bit line BL1. Transistor Q3 has its gate and transistor Q4 has its drain connected to bit line /BL1.

A node N3 between transistors Q1 and Q2 is connected to power supply node N1 via a transistor Q5 and power supply interconnection L1. Transistor Q5 receives a control signal $\phi 2$ at its gate for driving sense amplifiers SA1 and SA2. A node N4 between transistors Q3 and Q4 is connected to ground node N2 via a transistor Q6 and ground interconnection L2. Transistor Q6 receives a control signal $\phi 1$ at its gate for driving sense amplifiers SA1 and SA2.

In sense amplifier SA1 of the above-described structure, parasitic interconnection resistances R1 and R2 exit in power supply interconnection L1 and ground interconnection L2, respectively.

The structure of sense amplifier SA2 is similar to that of sense amplifier SA1. Sense amplifier SA2 has transistors Q7–Q12 connected in a manner similar to that of transistors Q1–Q6.

A memory cell MC1 is connected to bit line BL1. Memory cell MC1 includes a capacitor C1 for storing data and an NMOS transistor T1. Transistor T1 is connected between capacitor C1 and bit line BL1, and has its gate connected to a word line WL.

A memory cell MC2 is connected to bit line BL2. Memory cell MC2 includes a capacitor C2 for storing data and an NMOS transistor T2. Transistor T2 is connected between capacitor C2 and bit line BL2, and has its gate connected to word line WL.

The operation of the sense amplifier of FIG. 18 will be described hereinafter. First the operation of sense amplifier SA1 will be described.

By activation of word line WL, charge stored in memory cell MC1 is transferred to bit line BL1, whereby a slight potential difference is generated between bit lines BL1 and /BL1. Under this state, control signal $\phi 1$ attains a high level, and control signal $\phi 2$ attains a low level.

Here, the ON resistance of transistor Q1 becomes lower than that of transistor Q2 since the potential received at the gate of transistor Q1 is lower than that received at the gate of transistor Q2. Therefore, the potential of bit line BL1 is increased towards power supply potential $V_{CC}$.

Also, the ON resistance of transistor Q4 becomes smaller than that of transistor Q3 since the potential at the gate of transistor Q4 is higher than that at the gate of transistor Q3. Therefore, the potential of bit line /BL1 is lowered towards ground potential $V_{SS}$.

Therefore, the slight potential difference between bit lines BL1 and/BL1 is amplified with the potential difference between power supply potential $V_{CC}$ and ground potential $V_{SS}$ as a target value in sense amplifier SA1.

Sense amplifier SA2 carries out an operation similar to that of sense amplifier SA1. Therefore, the slight potential difference between bit lines BL2 and /BL2 is amplified with the potential difference between power supply potential $V_{CC}$ and ground potential $V_{SS}$ as a target value in sense amplifier SA2.

A semiconductor circuit may have a plurality of load circuits 5, one which is shown in FIG. 17, connected to one power supply interconnection L1 and one ground interconnection L2. FIG. 19 is a circuit diagram schematically showing a semiconductor circuit having a plurality of load circuits connected to one power supply interconnection and one ground interconnection.

Referring to FIG. 19, power supply interconnection L1 and ground interconnection L2 have a plurality of load circuits 51, 52, 53 and 54 connected thereto. In other words, the plurality of load circuits 51, 52, 53 and 54 share a power source.

In such a semiconductor circuit, there are respective connection nodes of load circuits 51–54 in power supply interconnection L1, and respective connection nodes of load circuits 51-54 in ground interconnection L2. In power supply interconnection L1, an interconnection resistance R11 exits between a connection node and power supply node N1. Also, respective interconnection resistances R12, R13 and R14 exit between respective connection nodes.

Similarly, in ground interconnection L2, an interconnection resistance R24 exits between a connection node of load circuit 54 and ground node N2. Also, respective interconnection resistances R21, R22, and R23 exist between respective connection nodes.

Load circuits 51–54 receive potentials $V_{CC1}$, $V_{CC2}$, $V_{CC3}$, and $V_{CC4}$ as power supply potential, and potentials $V_{SS1}$, $V_{SS2}$, $V_{SS3}$, and $V_{SS4}$ as ground potential, respectively.

Not all the load circuits of 51–54 are operated simultaneously, and there are cases when a load circuit is operated while another load circuit is not operated. Such an operating load circuit is called a selected circuit, and a load circuit not operating is called a de-selected circuit, hereinafter.

A typical example of one of load circuits 51–54 is a sense amplifier shown in FIG. 18. When each of load circuits 51–54 is a sense amplifier, load circuits 51–54 are divided into high readout sense amplifiers for reading out data of a high level from a memory cell, and low readout sense amplifiers for reading out data of a low level from a memory cell.

A control signal for driving the sense amplifier is applied simultaneously to a high readout sense amplifier and a low readout sense amplifier. When a control signal is applied simultaneously, a high readout sense amplifier initiates operation slightly before a low readout sense amplifier.

The reason thereof will be described hereinafter. For example, consider transistors Q3 and Q4 in FIG. 18. In the case of a high readout sense amplifier, transistor Q4 is turned on more deeply than transistor Q3 to lower the potential of bit line /BL1. In the case of a low readout sense amplifier, transistor Q3 is turned on more deeply than transistor Q4 to lower the potential of bit line BL1.

Here, transistor Q4 of the high readout sense amplifier is turned on before transistor Q3 of the low readout sense amplifier is turned on singe the initial gate voltage of sense amplifier Q4 of the high readout sense amplifier is higher than the initial gate voltage of transistor Q3 of the low readout sense amplifier. Therefore, the high readout sense amplifier operates prior to the low readout sense amplifier.

Thus, in a semiconductor circuit including a high readout sense amplifier and a low readout sense amplifier as load circuits, there are cases when the low readout sense amplifier has not initiated operation when the high readout sense amplifier is already operating. It can be said that a high readout sense amplifier is one type of the aforementioned selected circuit, and a low readout sense amplifier is one type of the aforementioned de-selected circuit.

A conventional semiconductor circuit including a sense amplifier as a load circuit has problems set forth in the following.

Referring to the semiconductor circuit of FIG. 17, an operation of load circuit 5 causes load current I1 to flow from power supply node N1 to load circuit 5, and current I2 from load circuit 5 to ground node N2. A flow of load current I1 causes reduction in the potential due to interconnection resistance R1, whereby the potential in load circuit 5 from power supply node N1 becomes lower than power supply potential $V_{CC}$. Also, a flow of load current I2 causes increase in the potential due to interconnection resistance R2, whereby the potential in load circuit 5 from ground node N2 becomes higher than ground potential $V_{SS}$.

There is a possibility that load circuit 5 does not operate properly when the potential in load circuit 5 from power supply node N1 and ground node N2 varies. Particularly in the sense amplifier shown in FIG. 18, the following problem occurs.

Referring to FIG. 18, a flow of load current I1 causes the potential of node N3 to become lower than power supply potential $V_{CC}$ due to interconnection resistance R1. Also, a flow of load current I2 causes the potential of node N4 to become higher than ground potential $V_{SS}$ due to resistance R2. If the potential of node N3 becomes lower than power supply potential $V_{CC}$ and the potential of node N4 becomes higher than ground potential $V_{SS}$ in a sense amplifier, a sense operation will take a longer time period.

A possible consideration is to increase the width of the power supply interconnection and the ground interconnection in order to solve this problem. However, increase of the width of the power supply interconnection and the ground interconnection will yield the problem of increasing the occupying area of the interconnection in a semiconductor chip.

Referring to FIG. 19, operation of any of load circuits 51–54 which is a selected circuit causes load current to flow to power supply interconnection L1 and ground interconnection L2.

Such a flow of load current causes variation in potential $V_{CC1}$–$V_{CC4}$ and $V_{SS1}$–$V_{SS2}$ to be received by load circuits 51–54 according to interconnection resistances R11–R14 and R21–R24. Not only the potential entering a selected circuit of load circuits 51–54, but also the potential entering a de-selected circuit varies.

When load circuits 51–54 are sense amplifiers, variation in the potential received by a de-selected circuit due to operation of a selected circuit induces the following problem. When the potential entering a low readout sense amplifier which is a de-selected circuit is altered due to operation of a high readout sense amplifier which is a selected circuit to result in increase in the potential at the ground potential side, transistor Q3 of FIG. 18, for example, will not be turned on. Therefore, the low readout sense amplifier will not operate properly.

As described above, there was a problem that a sense amplifier functioning as a load circuit receiving potential via power supply interconnection and ground interconnection cannot operate properly due to variation in the potential by interconnection resistance.

SUMMARY OF THE INVENTION

An object of the present invention is to suppress variation in the potential received by a load circuit caused by interconnection resistance in a semiconductor circuit device including a load circuit.

Another object of the present invention is to suppress variation in the potential received by a sense amplifier caused by interconnection resistance in a semiconductor circuit device including a sense amplifier.

A further object of the present invention is to increase the operating speed of a sense amplifier in a semiconductor circuit device including a sense amplifier.

A semiconductor circuit device according to the present invention includes a sense amplifier, a negative power supply circuit, a switching NMOS transistor, and a one shot pulse generation circuit.

The sense amplifier includes a PMOS transistor and an NMOS transistor. The negative power supply circuit generates a negative potential.

The switching NMOS transistor is provided between the NMOS transistor of said sense amplifier and said negative power supply circuit.

The one shot pulse generation circuit provides a one shot pulse signal to a gate of said switching transistor.

When a one shot pulse signal is applied to the switching NMOS transistor from the one shot pulse generation circuit at initiation of a sense operation of the sense amplifier, the switching NMOS transistor is turned on for a predetermined time period. The switching NMOS transistor attaining an ON state causes the NMOS transistor of the sense amplifier to be connected to the negative power supply circuit, whereby a potential lower than the ground potential is applied to the sense amplifier. This prevents the potential at the ground side from becoming higher than the ground potential due to interconnection resistance.

Therefore, rise of the potential of the NMOS transistor due to interconnection resistance can be suppressed in driving a sense amplifier. Therefore, variation in the potential received by the sense amplifier can be suppressed. Furthermore, the sense operation of the sense amplifier can be increased in speed.

A semiconductor circuit device according to another aspect of the present invention includes a ground node, a load circuit, a first ground interconnection, a second ground interconnection, a differential amplifying circuit, a negative power supply circuit, and a connection circuit.

The ground node receives a ground potential. The load circuit is at least supplied with potential from the ground node.

The first ground interconnection is provided between the ground node and the load circuit. The second ground interconnection has an input flow of current limited, for providing ground potential from the ground node.

The differential amplifying circuit differential-amplifies and provides the potential difference between the potential supplied to said load circuit via the first ground interconnection and the potential output from said second ground interconnection. The negative power supply circuit generates a potential lower than the ground potential.

The connection circuit receives an output signal of the differential amplifying circuit to connect the negative power supply circuit to the first ground interconnection in response to the output signal.

Because the second ground interconnection has the input flow of current limited, the ground potential is directly output. When current flows to the ground node via the first ground interconnection from the load circuit from the ground node due to operation thereof, the potential supplied to the load circuit from the ground node via the first ground interconnection becomes higher than the ground potential due to the interconnection resistance of the first ground interconnection.

A rise in the potential supplied to the load circuit via the first ground interconnection causes the voltage of the output signal of the differential amplifying circuit to increase. This increase in the voltage of the output signal causes the negative power supply circuit to be connected to the first ground interconnection. As a result, in addition to the current flowing towards the ground node from the load circuit via the first ground interconnection, the current flows towards the negative power supply circuit from the load circuit via the connection circuit.

This suppresses increase in the potential caused by interconnection resistance present in the first ground interconnection. As a result, variation is suppressed of the potential received by the load circuit. Therefore, variation in the potential received by a sense amplifier, when the load circuit is a sense amplifier, can be suppressed.

A semiconductor circuit device according to a further aspect of the present invention includes a power supply node, a load circuit, a first power supply interconnection, a second power supply interconnection, a differential amplifying circuit, a boosting power supply circuit, and a connection circuit.

The power supply node receives a power supply potential. The load circuit is at least supplied with the potential from the power supply node.

The first power supply interconnection is connected between the power supply node and the load circuit. The second power supply interconnection has the input flow of current limited, and provides power supply potential from the power supply node.

The differential amplifying circuit differential-amplifies, and outputs the potential difference between the potential supplied to the load circuit via the first power supply interconnection and the potential provided from the second power supply interconnection. The boosting power supply circuit generates a potential higher than the power supply potential.

The connection circuit receives an output signal from the differential amplifying circuit, and connects the boosting power supply circuit to the first power supply interconnection in response to the output signal.

Because the second power supply interconnection has the input flow of current limited, the power supply potential is directly output. When current flows to the load circuit from the power supply node via the first power supply interconnection due to an operation of the load circuit, the potential supplied to the load circuit is reduced due to the interconnection resistance of the first power supply interconnection.

Reduction in the potential supplied to the load circuit via the first power supply interconnection increases the value of the output signal of the differential amplifying circuit. Increase in the value of the output signal causes the boosting power supply circuit to be connected to the first power supply interconnection. As a result, in addition to the current flowing towards the load circuit from the power supply node via the first power supply interconnection, the current flows to the load circuit from the boosting power supply circuit via connection circuit.

Therefore, reduction in the potential due to interconnection resistance in the first power supply interconnection is suppressed. As a result, variation in the potential received by the load circuit can be suppressed. Thus, variation in the potential received by the sense amplifier, when the load circuit is a sense amplifier, can be suppressed.

A semiconductor circuit device according to a further aspect of the present invention includes a power supply node, a ground node, a load circuit, a first power supply interconnection, a second power supply interconnection, a first ground interconnection, a second ground interconnection, a first differential amplifying circuit, a second differential amplifying circuit, a boosting power supply circuit, a negative power supply circuit, a first connection circuit, and a second connection circuit.

The power supply node receives a power supply potential. The ground node receives a ground potential. Potential from at least the power supply node and the ground node is supplied to the load circuit.

The first power supply interconnection is provided between the power supply node and the load circuit. The second power supply interconnection has the input flow of current limited, and outputs the power supply potential from the power supply node.

The first ground interconnection is connected between the ground node and the load circuit. The second ground interconnection has input flow of current limited, and outputs the ground potential from the ground node.

The first differential amplifying circuit differential-amplifies and outputs the potential difference between the potential supplied to the load circuit via the first power supply interconnection and the potential output from the second power supply interconnection.

The second differential amplifying circuit differential-amplifies and outputs the potential difference between the potential supplied to the load circuit via the first ground interconnection and the potential output from the second ground interconnection.

The boosting power supply circuit generates a potential higher than the power supply potential. The negative power supply circuit generates a potential lower than the ground potential.

The first connection circuit responds to an output signal from the first differential amplifying circuit to connect the boosting power supply circuit to the first power supply interconnection.

The second connection means responds to an output signal from the second differential amplifying circuit to connect the negative power supply circuit to the first ground interconnection.

Therefore, the second power supply interconnection and the second ground interconnection both have the input flow of current limited. As a result, the power supply potential from the second power supply interconnection and the ground potential from the second ground interconnection are directly output.

When current flows towards the load circuit from the power supply node via the first power supply interconnection due to an operation of the load circuit, the potential supplied to the load circuit from the power supply node via the first power supply interconnection becomes lower than the power supply potential. This reduction in potential is caused by the interconnection resistance of the first power supply interconnection. Similarly, when current flows towards the ground node from the load circuit via the first ground interconnection due to operation of the load circuit, the potential supplied to the load circuit from the ground node via the first ground interconnection rises. This rise in potential is caused by the interconnection resistance of the first ground interconnection.

When the potential supplied to the load circuit from the power supply node via the first power supply interconnection is reduced, the value of the output signal of the first differential amplifying circuit is increased. Similarly, when the potential supplied to the load circuit from the ground node via the first ground interconnection is raised, the value of the output signal of the second differential amplifying circuit is increased.

This increase in the value of the output signal of the first differential amplifying circuit causes the boosting power supply circuit to be connected to the first power supply interconnection. Therefore, in addition to the current flowing towards the load circuit from the power supply node via the first power supply interconnection, the current flows towards the load circuit from the boosting power supply circuit via the first connection circuit. As a result, reduction in potential caused by the interconnection resistance present in the first power supply interconnection is suppressed.

When the value of the output signal of the second differential amplifying circuit increases, the negative power supply circuit is connected to the first ground interconnection. Therefore, in addition to the current flowing towards the ground node from the load circuit via the first ground interconnection, the current flows towards the negative power supply circuit via the second connection circuit from the load circuit. As a result, a rise in the potential caused by interconnection resistance in the first ground interconnection is suppressed.

As described above, increase and reduction of the potential supplied to the load circuit is suppressed. This prevents variation in the high potential and the low potential received by the load circuit. When the load circuit is a sense amplifier, variation in high potential and low potential received by the sense amplifier can be suppressed.

A semiconductor circuit device according to a still further aspect of the present invention includes a ground node, a plurality of load circuits, a first ground interconnection, a second ground interconnection, a plurality of differential amplifying circuits, a negative power supply circuit and a plurality of connection circuits.

The ground node receives a ground potential. The plurality of load circuits is supplied with potential at least from the ground node.

The first ground interconnection is connected in common between the ground node and the respective plurality of load circuits. The second ground interconnection has the input flow of current limited, and outputs the ground potential from the ground node.

The plurality of differential amplifying circuits are provided corresponding to the plurality of load circuits respectively. Each differential amplifying circuit differential-amplifies and outputs the potential difference between the potential supplied to a corresponding load circuit via the first ground interconnection and the potential output from the second ground interconnection. The negative power supply circuit generates a potential lower than the ground potential.

The plurality of connection circuits are provided respectively corresponding to the plurality of load circuits and the plurality of differential amplifying circuits. Each connection circuit receives an output signal of a corresponding differential amplifying circuit, and connects the negative power supply circuit to the portion of the first ground interconnection provided in a corresponding load circuit in response to the output signal.

Because the second ground interconnection has the input flow of current limited, the ground potential from the second ground interconnection is directly output. When current flows towards the ground node from any of the plurality of load circuits via the first ground interconnection due to an operation of that load circuit, the potential supplied to each load circuit from the ground node via the first ground interconnection increases. This increase in potential is caused by the interconnection resistance of the first ground interconnection.

When the potential supplied to the load circuit from the ground node via the first ground interconnection rises, the value of the output signal of a differential amplifying circuit corresponding to each load circuit increases. This increase in the value of the output signal of each differential amplifying circuit causes the negative power supply circuit to be connected to the portion of the first ground interconnection provided in a corresponding load circuit by a corresponding connection circuit.

Therefore, in addition to the current flowing towards the ground node from the operating load circuit via the first ground interconnection, the current flows towards the negative power supply circuit from the operating load circuit via the corresponding connection circuit. As a result, a rise in the potential of each load circuit caused by the interconnection resistance in the first ground interconnection is suppressed.

Therefore, a potential lower than the ground potential is supplied to the load circuit in which the supplied potential is increased. This prevents the potential supplied to the load circuits from rising. As a result, variation in the potential received by each load circuit is suppressed. When each load circuit is a sense amplifier, variation in the potential received by the sense amplifier can be suppressed.

A semiconductor circuit device according to yet another aspect of the present invention includes a power supply node, a plurality of load circuits, a first power supply interconnection, a second power supply interconnection, a plurality of differential amplifying circuits, a boosting power supply circuit, and a plurality of connection circuits.

The power supply node receives a power supply potential. The plurality of load circuits is supplied with potential from at least the power Supply node.

The first power supply interconnection is provided in common between the power supply node and the plurality of respective load circuits. The second power supply interconnection has the input flow of current limited, and outputs the power supply potential from the power supply node.

The plurality of differential amplifying circuits are provided corresponding to the plurality of load circuits respectively. Each differential amplifying circuit differential-amplifies and outputs the potential difference between the potential supplied to a corresponding load circuit via the first power supply interconnection and the potential output from the second power supply interconnection. The boosting power supply circuit generates a potential higher than the power supply potential.

The plurality of connection circuits are provided corresponding to the plurality of load circuits and the plurality of differential amplifying circuits respectively. Each connection circuit receives an output signal of a corresponding differential amplifying circuit, and connects the potential generation circuit to the portion of the first power supply interconnection provided in a corresponding load circuit in response to the output signal.

Because the second power supply interconnection has the input flow of the current limited, the power supply potential from the second power supply interconnection is directly output. When current flows to the load circuit from the power supply node via the first power supply interconnection due to operation of any of the plurality of load circuits, the potential supplied to each load circuit from the power supply node via the first power supply interconnection is reduced. This reduction in potential is caused by the interconnection resistance in the first power supply interconnection.

When the potential supplied to each load circuit from the power supply node via the first power supply interconnection is reduced, the value of an output signal from a differential amplifying circuit corresponding to each load circuit is increased. This increase in the value of the output signal of each differential amplifying circuit connects the boosting power supply circuit to the portion of the first power supply interconnection provided in a corresponding lead circuit by a corresponding connection circuit.

Therefore, in addition to the current flowing towards an operating load circuit from the power supply node via the first power supply interconnection, the current flows towards an operating circuit from the boosting power supply circuit via the corresponding connection circuit. As a result, the potential of each load circuit caused by the interconnection resistance in the first power supply interconnection is prevented from being reduced.

Therefore, a potential higher than the power supply potential is supplied to the load circuit in which the supply potential is reduced. Therefore, variation in the potential supplied to that load circuit is suppressed. As a result, variation in the potential received by each load circuit is suppressed. When each load circuit is a sense amplifier, variation in the potential received by the sense amplifier can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4(a)–4(i) are a timing chart showing the operation of the semiconductor circuit of FIG. 1.

FIGS. 6(a)–6(g) are a timing chart showing the operation of the semiconductor circuit of FIG. 5.

FIGS. 16(a)–16(d) are a timing chart of each signal of the column address buffer of FIG. 15.

DESCRIPTION OF THE PREFERRED EMBODIMENTS

The embodiments of the present invention will be described hereinafter with reference to the drawings.

Embodiment 1

Figure 1:
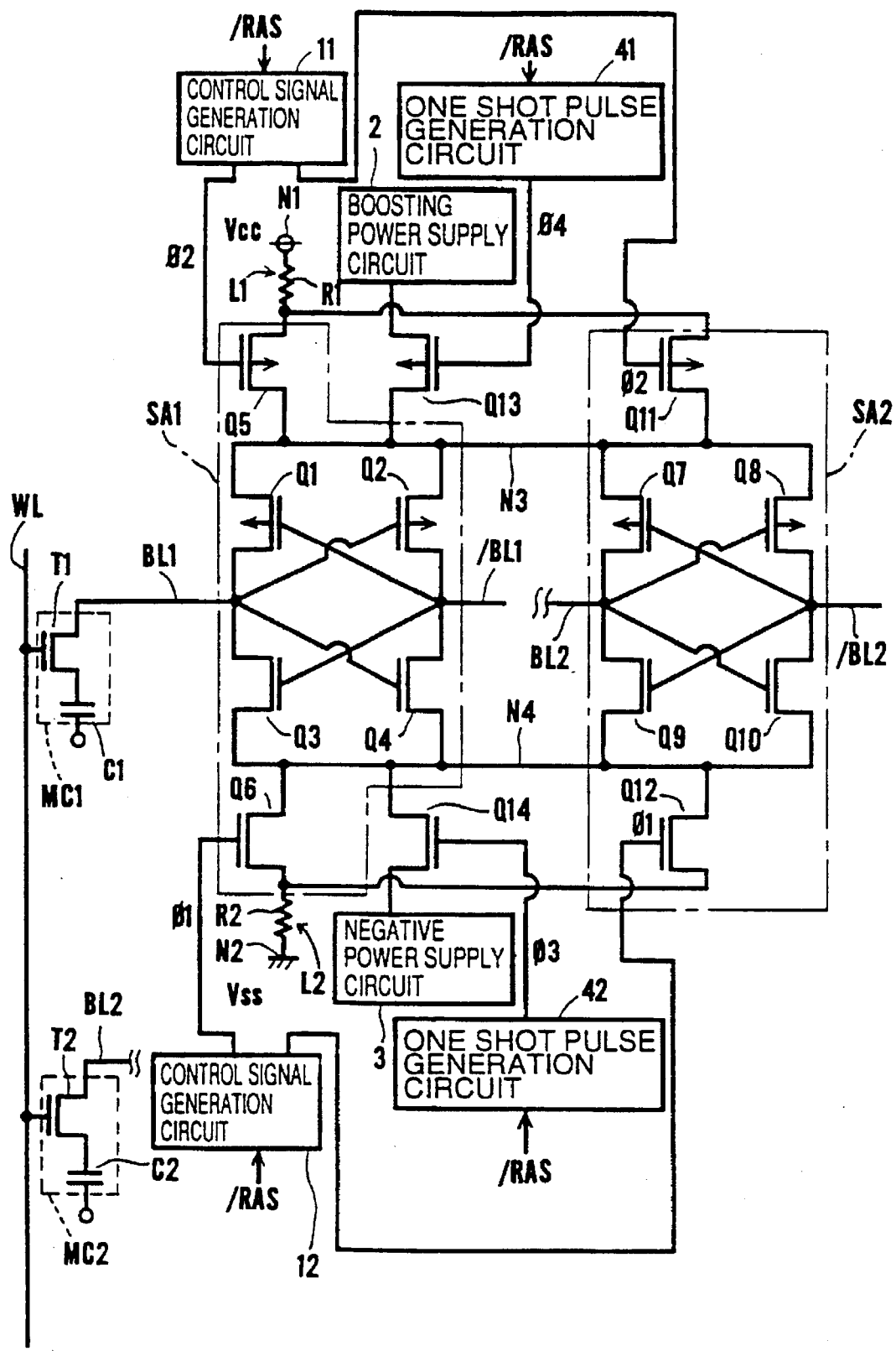
FIG. 1 is a circuit diagram of a semiconductor circuit according to a first embodiment of the present invention.

FIG. 1 is a circuit diagram showing a structure of a semiconductor circuit according to a first embodiment. In the semiconductor circuit of FIG. 1, components corresponding to those of the semiconductor circuit of FIG. 18 have the same reference characters denoted.

Figure 18:
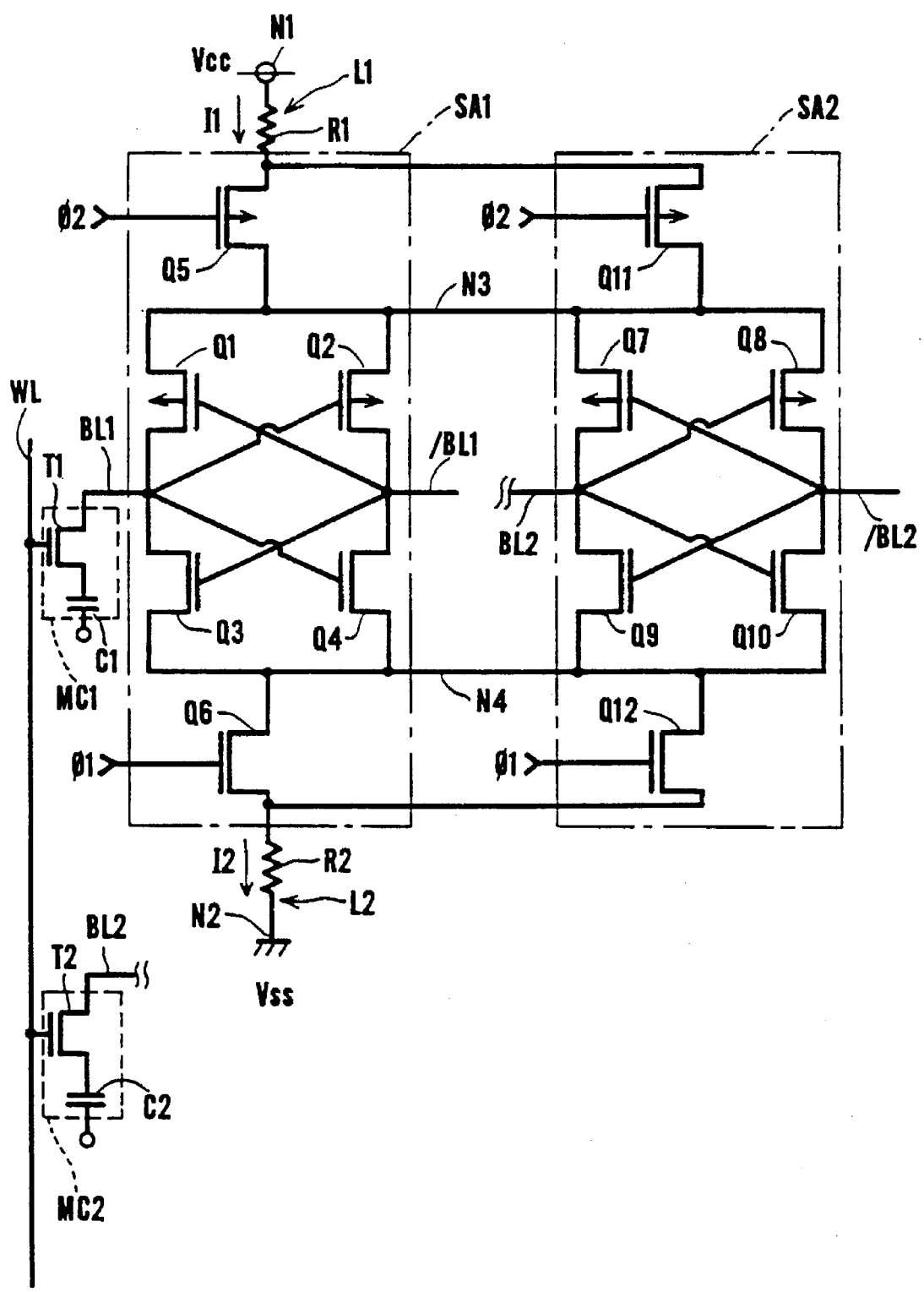
FIG. 18 is a circuit diagram of a conventional sense amplifier.

The semiconductor circuit of FIG. 1 differs from the semiconductor circuit of FIG. 18 in that a boosting power supply circuit 2, a PMOS transistor Q13 for switching, a negative power supply circuit 3, an NMOS transistor Q14 for switching, and one shot pulse generation circuits 41 and 42 are provided.

Control signals $\phi1$ and $\phi2$ are generated by control signal generation circuits 12 and 11, respectively. Control signal generation circuits 11 and 12 receive a row address strobe signal /RAS to generate control signals $\phi1$ and $\phi2$ in response to that signal.

The components of the semiconductor circuit of FIG. 1 differing from those of FIG. 18 will be described hereinafter.

Referring to FIG. 1, boosting power supply circuit 2 functions to generate a potential higher than power supply potential $V_{CC}$. Transistor Q13 is connected between boosting power supply circuit 2 and a node N3. One shot pulse generation circuit 41 receives row address strobe signal /RAS. A one shot pulse signal $\phi4$ for turning on/off transistor Q13 is provided to the gate of transistor Q13 from one shot pulse generation circuit 41.

Negative power supply circuit 3 functions to generate a potential lower than ground potential $V_{SS}$. Transistor Q14 is connected between negative power supply circuit 3 and node N4. One shot pulse generation circuit 42 receives row address strobe signal /RAS. A one shot pulse signal $\phi3$ for turning on/off transistor Q14 is applied to the gate of transistor Q14 from one shot pulse generation circuit 42.

Figure 2:
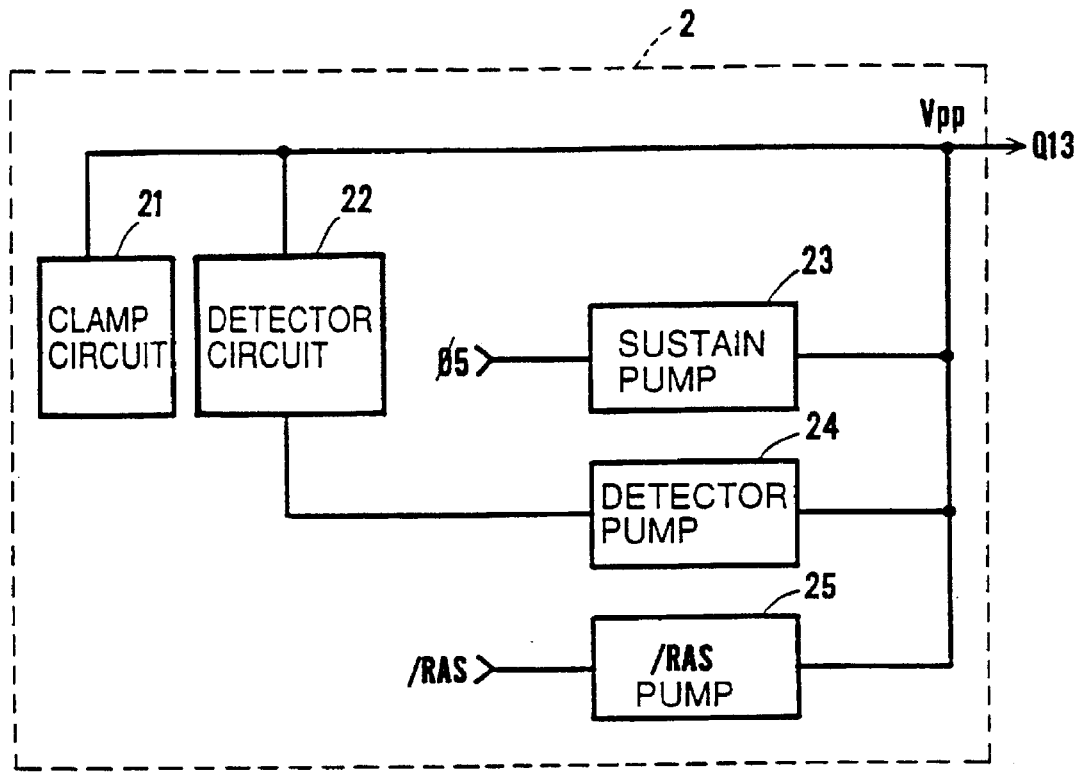
FIG. 2 is a block diagram showing a structure of a boosting power supply circuit.

FIG. 2 is a block diagram showing a structure of boosting power supply circuit 2 of FIG. 1. Boosting power supply circuit 2 includes a clamp circuit 21, a detector circuit 22, a sustain pump 23, a detector pump 24 and a /RAS pump 25.

Sustain pump 23 receives a control signal Control signal $\phi5$ always attains a high level when the power source is turned on. Sustain pump 23 operates when control signal $\phi5$ attains a high level for boosting boost voltage $V_{PP}$ to a predetermined potential. /RAS pump 25 receives row address strobe signal /RAS. /RAS pump 25 operates when row address strobe signal /RAS attains a low level for boosting boost potential $V_{PP}$ to a predetermined voltage.

Clamp circuit 21 operates when boost potential $V_{PP}$ becomes higher than a predetermined first set value to clamp boost potential $V_{PP}$ at the first set value. The upper limit of boost potential $V_{PP}$ is determined by clamp circuit 21. When boost voltage $V_{PP}$ becomes lower than a predetermined second set value, detector circuit 22 provides a control signal to detector pump 24. The second set value is lower than the first set value. Detector pump 24 operates in response to a driving signal from detector circuit 22 to boost potential In boosting power supply circuit 2, a constant boost potential $V_{PP}$ is generated by operation of these pumps.

Figure 3:
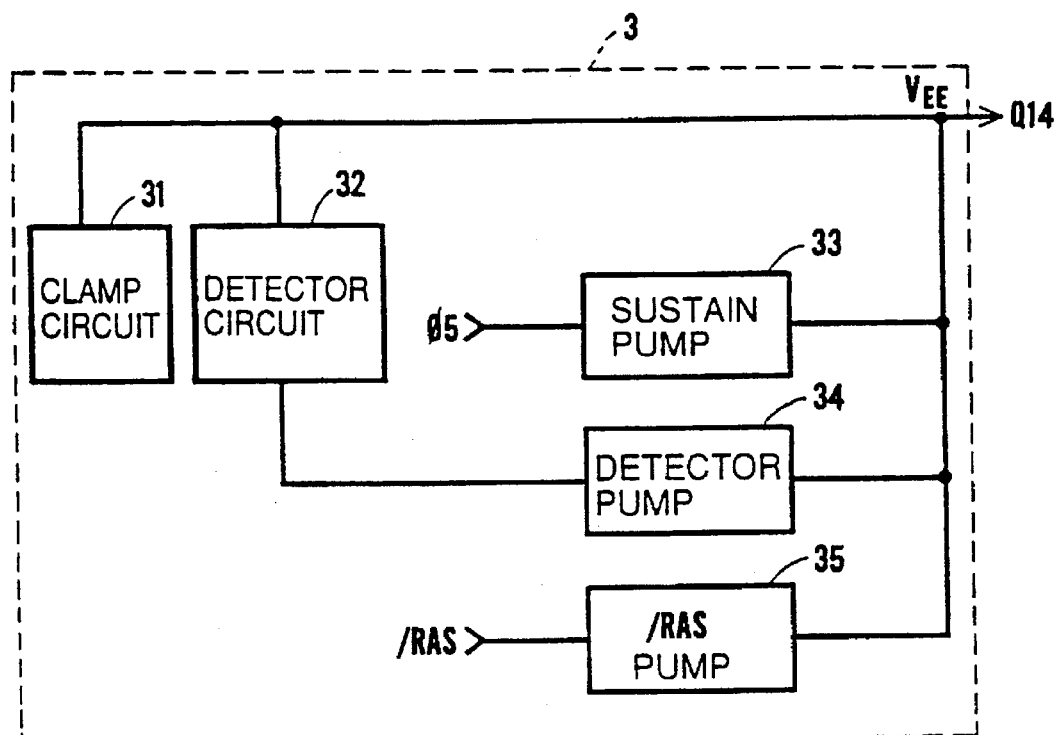
FIG. 3 is a block diagram showing in detail a structure of a negative power supply circuit.

FIG. 3 is a block diagram showing a structure of negative power supply circuit 3 of FIG. 1. Negative power supply circuit 3 includes a clamp circuit 31, a detector circuit 32, a sustain pump 33, a detector pump 34 and a /RAS pump 35.

Sustain pump 33 receives control signal $\phi5$. Sustain pump 33 sets negative potential $V_{EE}$ to a predetermined potential when control signal $\phi5$ attains a high level, i.e. power is turned on. /RAS pump 35 receives row address strobe signal /RAS. /RAS pump 35 operates when row address strobe signal /RAS attains a low level to set negative potential $V_{EE}$ at a predetermined potential.

Clamp circuit 31 operates when negative potential $V_{EE}$ becomes lower than the predetermined first set value to clamp negative potential $V_{SS}$ at the first set value. The lower limit of negative potential $V_{EE}$ is determined by clamp circuit 31. When negative potential $V_{EE}$ becomes higher than a predetermined second set value, detector circuit 32 provides a .driving signal to detector pump 34. The second set value is higher than the first set value. Detector pump 34 operates in response to a driving signal from detector circuit 32 to reduce negative potential $V_{EE}$.

In negative power supply circuit 3, negative potential $V_{EE}$ is generated by operation of these pumps.

An operation of the semiconductor circuit of FIG. 1 will be described with reference to FIG. 4 showing a timing chart thereof. In this timing chart, respective potentials are shown of row address strobe signal /RAS, word line WL, one shot pulse signals $\phi3$ and $\phi4$, control signals $\phi1$ and $\phi2$, nodes N3 and N4, and bit lines BL and /BL.

Prior to initiation of the sense operation of sense amplifiers SA1 and SA2, nodes N3 and N4 are respectively precharged at the potential of ½ $V_{CC}$. After row address strobe signal /RAS falls to a low level, word line WL is activated. This causes charge stored in memory cell MC1 to be transmitted to bit line BL1, whereby a slight potential difference is generated between bit lines BL1 and /BL1.

After an elapse of a predetermined time from the fall of row address strobe signal /RAS, one shot pulse signals $\phi3$ and $\phi4$ attain a high level and a low level, respectively. This causes transistors Q13 and Q14 to be turned on, whereby negative power supply circuit 3 is connected to node N4 and boosting power supply circuit 2 is connected to node N3.

As a result, the potential of node N4 is lowered to the level of negative potential $V_{EE}$, and the potential of node N3 is raised to the level of boost potential $V_{PP}$. Then, a sense operation of sense amplifier SA1 is initiated. By operations of transistors Q1–Q4, the potential of bit line BL1 is forced to rise to the level of boost potential $V_{PP}$ and the potential of bit line /BL1 is forced to be reduced to the level of negative potential $V_{EE}$.

Afterwards, one shot pulse signal $\phi3$ falls to a low level and one shot pulse signal $\phi4$ rises to a high level. Here, the potentials of nodes N3 and N4 which are the source potentials of transistors Q1–Q4 are stable. The potential of node N3 is sufficiently high, and the potential of node N4 is sufficiently low. There is a sufficient potential difference between bit lines BL1 and /BL1.

Then, control signal $\phi1$ rises to a high level, and control signal $\phi2$ falls to a low level. This causes the potential of node N4 to rise to the vicinity of ground potential $V_{SS}$, and the potential of node N3 to fall to the vicinity of power supply potential $V_{CC}$.

The timing of control signals $\phi1$ and $\phi2$ attaining a high level and a low level, respectively, is preferably the timing when the potential difference between bit lines BL1 and /BL1 as shown in FIG. 4 is great enough.

This is because the simultaneous turning on of transistors Q5 and Q13 and transistors Q6 and Q14 will cause current to flow towards power supply node N1 from boosting power supply circuit 2 and towards negative power supply circuit 3 from ground node N2.

Sense amplifier SA2 carried out an operation similar to the above-described operation of sense amplifier SA1.

The semiconductor circuit of FIG. 1 provides the following effect. Because the potential of node N3 can be made higher than power supply potential $V_{CC}$ by boosting power supply circuit 2 and the potential of node N4 can be made lower than the ground potential $V_{SS}$ by negative power supply circuit 3, transistors Q1–Q4, and Q7–Q10 forming sense amplifiers SA1 and SA2 can be made to be deeply turned on. As a result, the sense operation is speeded.

Furthermore, the semiconductor circuit of FIG. 1 has boosting power supply circuit 2 connected to sense amplifiers SA1 and SA2, and then power supply node N1 and ground node N2 connected to nodes N3 and N4, respectively, when the potential difference between bit lines BL1 and /BL1 becomes great enough in a sense operation. Therefore, reduction in the potential caused by interconnection resistance R1 and rise of the potential of node N4 caused by interconnection resistance R2 can be suppressed irrespective of the values of interconnection resistances R1 and R2. It is therefore not necessary to increase the width of power supply interconnection L1 and ground interconnection L2 in order to reduce interconnection resistances R1 and R2.

Embodiment 2

Figure 5:
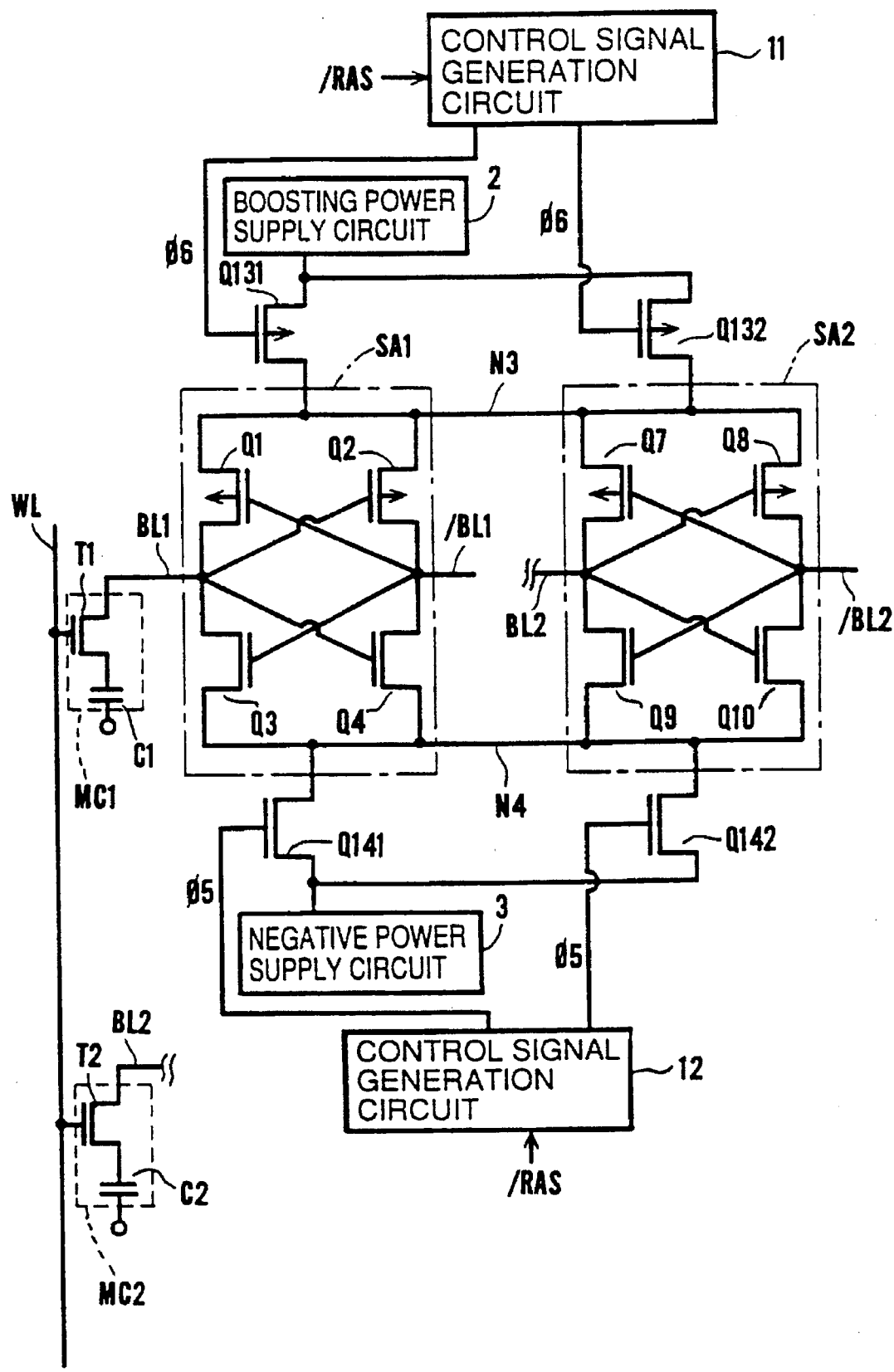
FIG. 5 is a circuit diagram of a semiconductor circuit according to a second embodiment.

A semiconductor circuit according to a second embodiment of the present invention will be described with reference to the circuit diagram of FIG. 5. In FIG. 5, components corresponding to those in FIG. 1 have the same reference characters denoted.

The difference of the semiconductor circuit of FIG. 5 over that of FIG. 1 is set forth in the following. Power supply node N1, power supply interconnection L1, ground node N2, ground interconnection L2, transistors Q5 and Q6, and one shot pulse generation circuits 41 and 42 are removed. Transistors Q131 and Q132 are provided between boosting power supply circuit 2 and node N3, and transistors Q141 and Q142 are provided between negative power supply circuit 3 and node N4.

Transistors Q131 and Q132 respectively receive a control signal φ6 provided from a control signal generation circuit 11 at its gate. Transistors Q141 and Q142 receive a control signal φ5 provided from a control signal generation circuit 12 at its gate.

The operation of the semiconductor circuit of FIG. 5 will be described with reference to the timing chart of FIG. 6. In this timing chart, respective potentials are shown of row address strobe signal /RAS, word line WL, control signals φ5, φ6, nodes N3 and N4, and bit lines BL1 and /BL1.

Referring to FIG. 6, the operation up to the generation of a small potential difference between bit lines BL1 and /BL1 is identical to that shown in the timing chart of FIG. 4.

After an elapse of a predetermined time from the fall of row address strobe signal /RAS, control signal φ5 rises, and control signal φ6 falls. This causes transistors Q141 and Q142 and transistors Q131 and Q132 to be turned on. As a result, negative power supply circuit 3 is connected to node 4, and boosting power supply circuit 2 is connected to node N3.

This causes the potential of node N4 to be reduced to the level of negative potential $V_{EE}$, and the potential of node N3 to be raised to the level of boost potential $V_{PP}$. Accordingly, the potential of bit line BL1 is raised to the level of boost potential $V_{PP}$ and the potential of bit line /BL1 is reduced to the level of negative potential $V_{EE}$ due to a sense operation of transistors Q1–Q4.

The operation of sense amplifier SA2 is similar to the above-described operation of sense amplifier SA1.

In the semiconductor circuit of FIG. 5, the potential of node N3 is made higher than power supply potential $V_{CC}$ by boosting power supply circuit 2, and the potential of node N4 is made lower than ground potential $V_{SS}$ by negative power supply circuit 3 in a sense operation. Therefore, transistors Q1–Q4 and transistors Q7–Q10 forming sense amplifiers SA1 and SA2, respectively, can be deeply turned on. As a result, the speed of a sense operation is increased.

Furthermore, because it is not necessary to supply potential from power supply node N1 and ground node N2, variation in the supplied potential caused by interconnection resistance can be eliminated.

Embodiment 3

A semiconductor circuit according to a third embodiment will be described hereinafter with reference to FIG. 7. Components in FIG. 7 corresponding to those of FIG. 17 have the same reference characters denoted.

Figure 7:
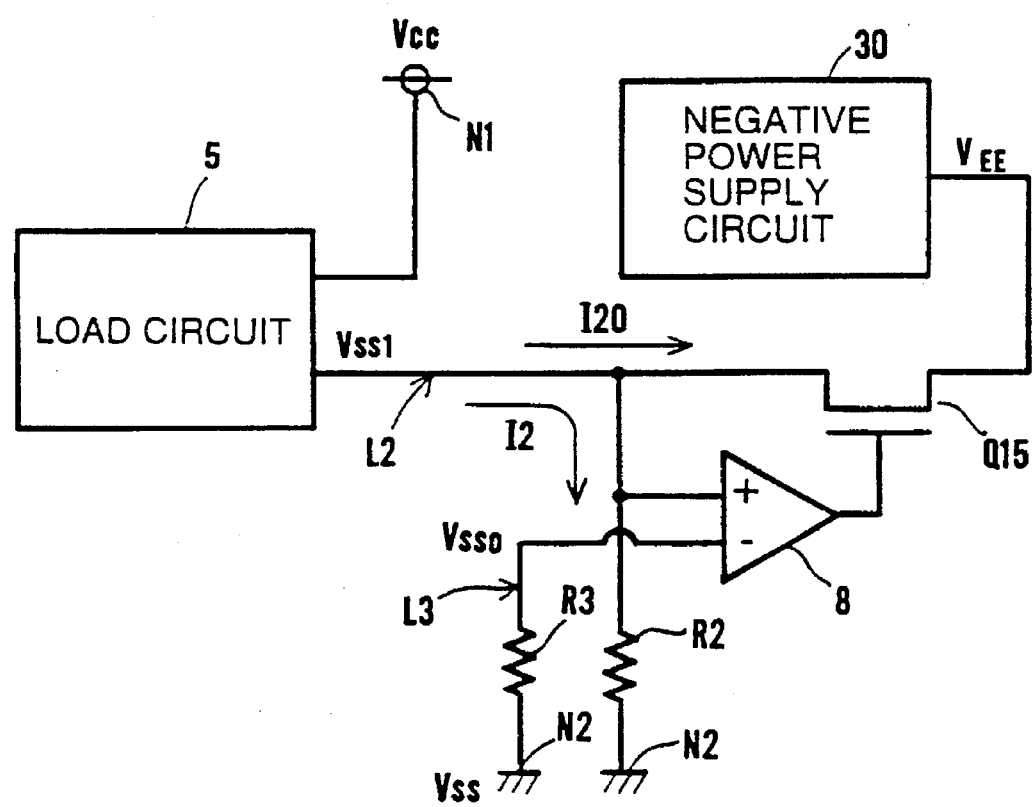
FIG. 7 is a circuit diagram of a semiconductor circuit according to a third embodiment.
Figure 17:
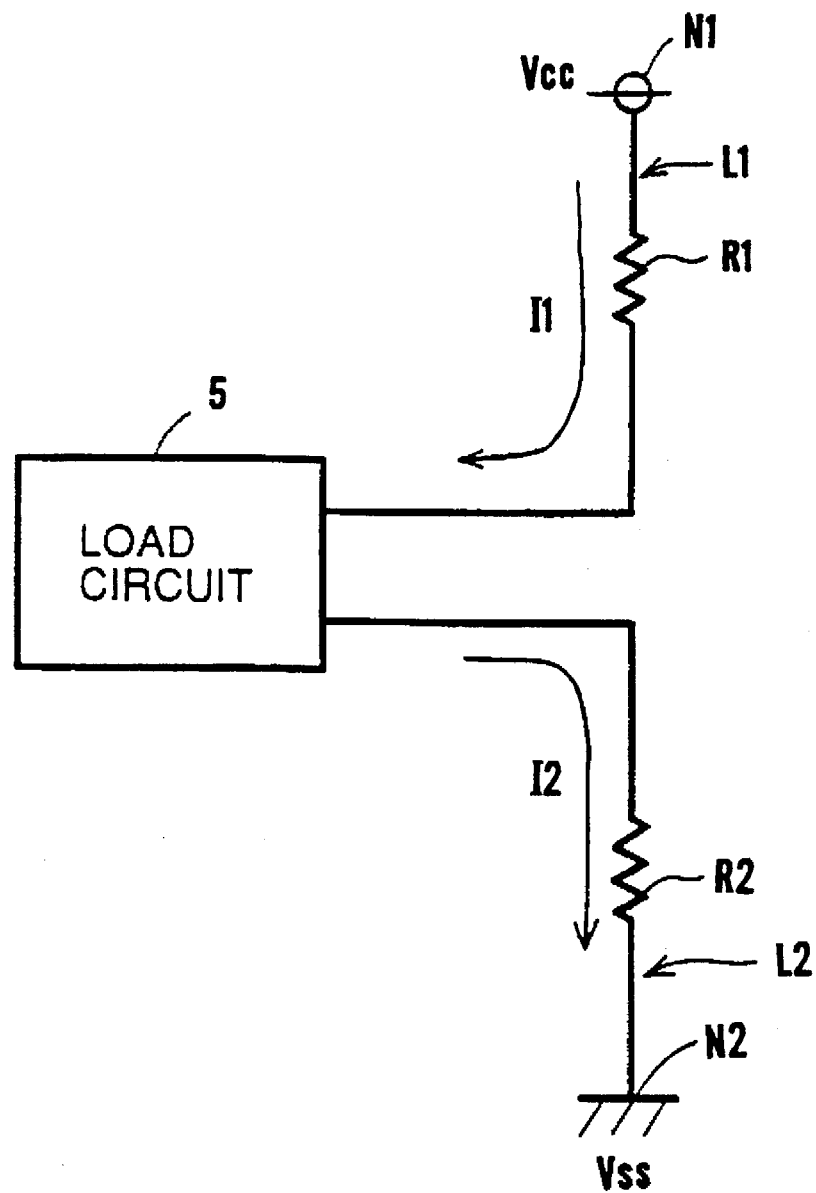
FIG. 17 is a block diagram schematically showing the connection manner of a conventional load circuit.

Referring to FIG. 7, the semiconductor circuit of FIG. 7 differs from the semiconductor circuit of FIG. 17 in that a second ground interconnection L3 is provided in addition to the first ground interconnection L2. Also, a differential amplifier 8, an NMOS transistor Q15 for switching, and a negative power supply circuit 30 are provided.

The components of the semiconductor circuit of FIG. 7 differing from those of FIG. 17 will be described. Referring to FIG. 7, negative power supply circuit 30 functioning to generate a negative potential $V_{EE}$ lower than ground potential $V_{SS}$ is connected partway of first ground interconnection L2 via transistor Q15. This negative power supply circuit 30 is similar to, for example, the negative power supply circuit shown in FIG. 3. A positive input terminal of differential amplifier 8 is connected partway of first ground interconnection L2. A negative input terminal of differential amplifier 8 is connected to one end of second ground interconnection L3. An output terminal of differential amplifier 8 is connected to the gate of transistor Q15.

In a semiconductor circuit of the above-described structure, an interconnection resistance R2 is present in first ground interconnection L2, and a second interconnection resistance R3 is present in second ground interconnection L3. There is a current path in first ground interconnection L2. Potential $V_{SS1}$ output from a first ground interconnection L2 is raised higher than ground potential $V_{SS}$ by interconnection resistance R2.

There is no current path in second ground interconnection L3. Therefore, potential $V_{SS0}$ output from second ground interconnection L3 is substantially equal to ground potential $V_{SS}$ (0 V).

Therefore, potential $V_{SS0}$ provided from second ground interconnection L3 is used as the reference potential in differential amplifier 8. Potential $V_{SS0}$ is referred to as reference potential $V_{SS0}$ hereinafter.

Figure 8:
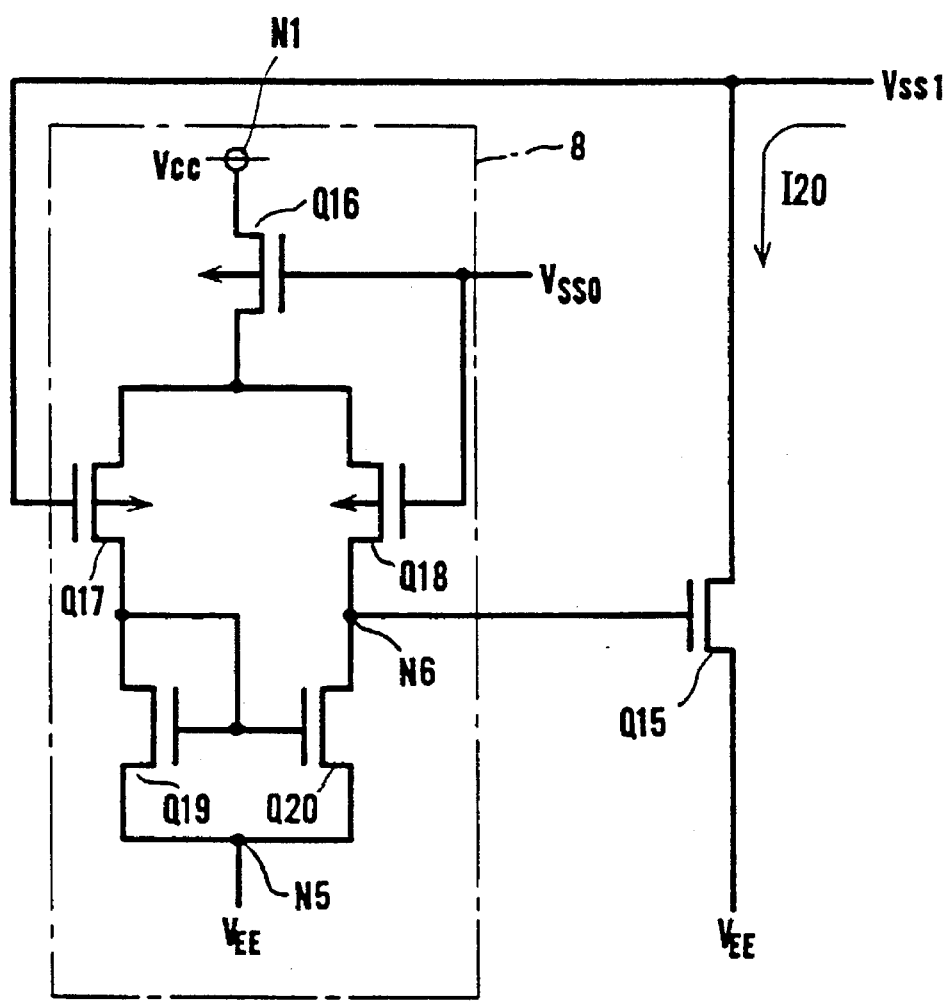
FIG. 8 is a circuit diagram showing a structure of a differential amplifier shown in FIG. 7.

Differential amplifier 8 will be described hereinafter with reference to FIG. 8 which is a detailed circuit diagram of differential amplifier 8 shown in FIG. 7. Referring to FIG. 8, differential amplifier 8 includes PMOS transistors Q16, Q17 and Q18, and NMOS transistors Q19 and Q20.

Transistors Q16, Q17 and Q19 are connected in series between power supply node N1 and node N5 receiving negative potential $V_{EE}$. Transistors Q18 and Q20 are connected in series between transistor Q16 and node N5.

The respective gates of transistors Q16 and Q18 receive reference potential $v_{SS0}$. The gate of transistor Q17 receives potential $V_{SS1}$. The gate of transistors Q19 and Q20 are connected to the node between transistors Q17 and Q19. Node N6 between transistors Q18 and Q20 is connected to the gate of transistor Q15. In other words, differential amplifier 8 is a current mirror type differential amplifier.

An operation of the semiconductor circuit of FIG. 7 will be described hereinafter. When potential $V_{SS1}$ is higher than reference potential $V_{SS0}$, the potential supplied to the gate of transistor Q15 from differential amplifier 8 is increased. Referring to differential amplifier 8 of FIG. 8, transistor Q18 is turned on more deeply than transistor Q17 when potential $V_{SS1}$ is higher than reference potential $V_{SS0}$ to increase the potential of node N6. As a result, the gate potential of transistor Q15 increases.

When the gate potential of transistor Q15 becomes higher than the threshold voltage of transistor Q15, transistor Q15 is turned on. This causes load current I20 to flow from potential $V_{SS1}$ towards negative potential $V_{EE}$. Therefore, load current I20 flows from first ground interconnection L2 towards negative power supply circuit 30 as shown in FIG. 7.

As a result, the load current from load circuit 5 is divided into load current I2 and load current I20. Therefore, load current I2 is reduced. This prevents increase in the potential of $V_{SS1}$ by interconnection resistance R2. Here, load current I20 serves to reduce the variation width of potential $V_{SS1}$ due to change in ground potential $V_{SS}$ caused by noise because load current I20 is increased/reduced according to variation of potential $V_{SS1}$ to suppress variation of load current I2.

Embodiment 4

Figure 9:
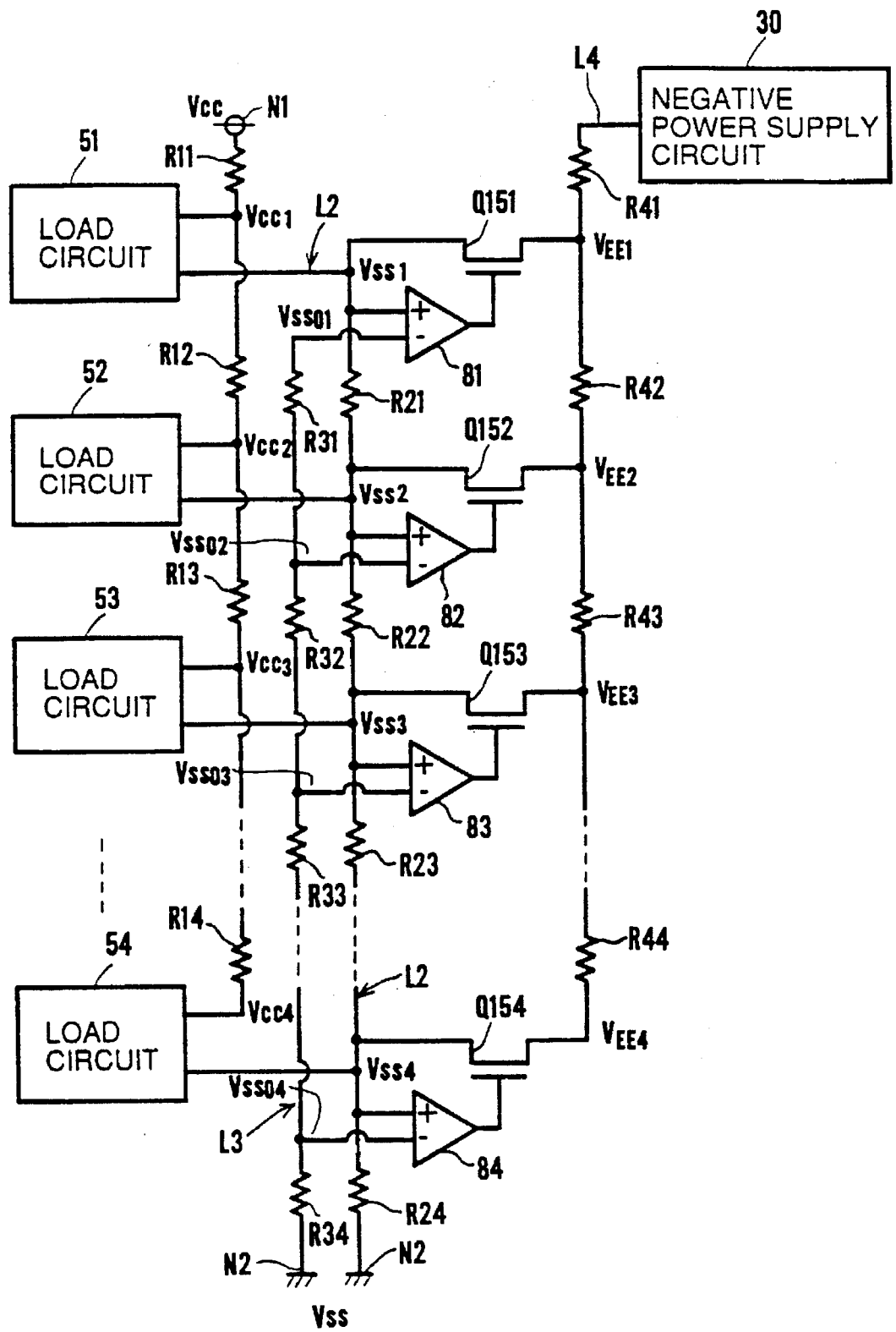
FIG. 9 is a circuit diagram of a semiconductor circuit according to a fourth embodiment.

FIG. 9 is a circuit diagram according to a fourth embodiment wherein a plurality of the semiconductor circuits shown in FIG. 7 are connected to a common power source. In FIG. 9, components corresponding to those of FIG. 19 have the same reference characters denoted.

Figure 19:
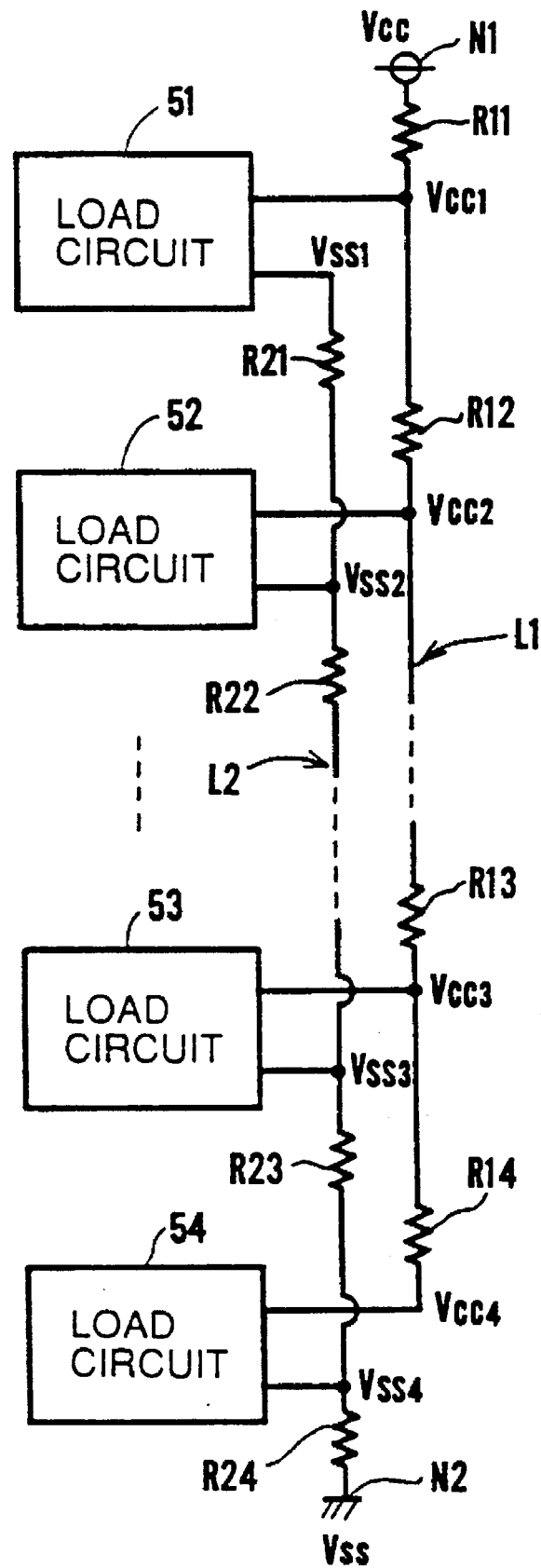
FIG. 19 is a circuit diagram of a conventional semiconductor circuit having a plurality of load circuits connected to one power supply interconnection and one ground interconnection.

The semiconductor circuit of FIG. 9 differs from the semiconductor circuit of FIG. 19 in that a second ground interconnection L3 is provided in addition to first ground interconnection L2. Also, differential amplifiers 81–84, NMOS transistors Q151–Q154, and a negative power supply circuit 30 are provided.

Each of differential amplifiers 81–84 have a function similar to that of the differential amplifier 8 shown in FIG. 8. Each of transistors Q151–Q154 have a function similar to that of transistor Q15 shown in FIG. 8.

Differential amplifier 81 and transistor Q151 are provided corresponding to load circuit 51. Differential amplifier 82 and transistor Q152 are provided corresponding to load circuit 52. Differential amplifier 83 and transistor Q153 are provided corresponding to load circuit 53. Differential amplifier 84 and transistor Q154 are provided corresponding to load circuit 54. Negative power supply circuit 30 is provided in common to respective load circuits 51–54.

In second ground interconnection L3, interconnection resistances R31–R34 are present as in first ground interconnection L2. However, there is no current path in second ground interconnection L3. Therefore, reference potentials $V_{SS01}$–$V_{SS04}$ provided to differential amplifiers 81–84, respectively, are substantially equal to ground potential $V_{SS}$.

Interconnection resistances R41–R44 are also present in an interconnection L4 between negative power supply circuit 30 and respective transistors Q151–Q154. However, if the generated potential of negative power supply circuit 30 is set so that potentials $V_{EE1}$–$V_{EE4}$ received by transistors Q151–Q154, respectively, are negative, increase in potentials $V_{SS1}$–$V_{SS4}$ can be prevented from the functions of differential amplifiers 81–84 and transistors Q151–Q154.

The operation of the semiconductor circuit of FIG. 9 will be described hereinafter. Description is made on the assumption that load circuit 52 is a selected circuit, load circuit 51 is a de-selected circuit, and load circuit 51 does not operate when load circuit 52 is operating. When load circuit 52 operates, potential $V_{SS2}$ received by load circuit 52 rises by interconnection resistances R22, R23 and R24. Accordingly, potential $V_{SS1}$ received by load circuit 51 rises.

When potential $V_{SS1}$ rises, differential amplifier 81 and transistor Q151 operate to reduce potential $V_{SS1}$. Therefore, a rise in potential of a de-selected circuit caused by operation of a selected circuit will be suppressed.

In load circuit 52 which is a selected circuit, differential amplifier 82 and transistor Q152 operate to reduce potential $V_{SS2}$. Therefore, a rise in the potential of a selected circuit itself is suppressed.

Figure 10:
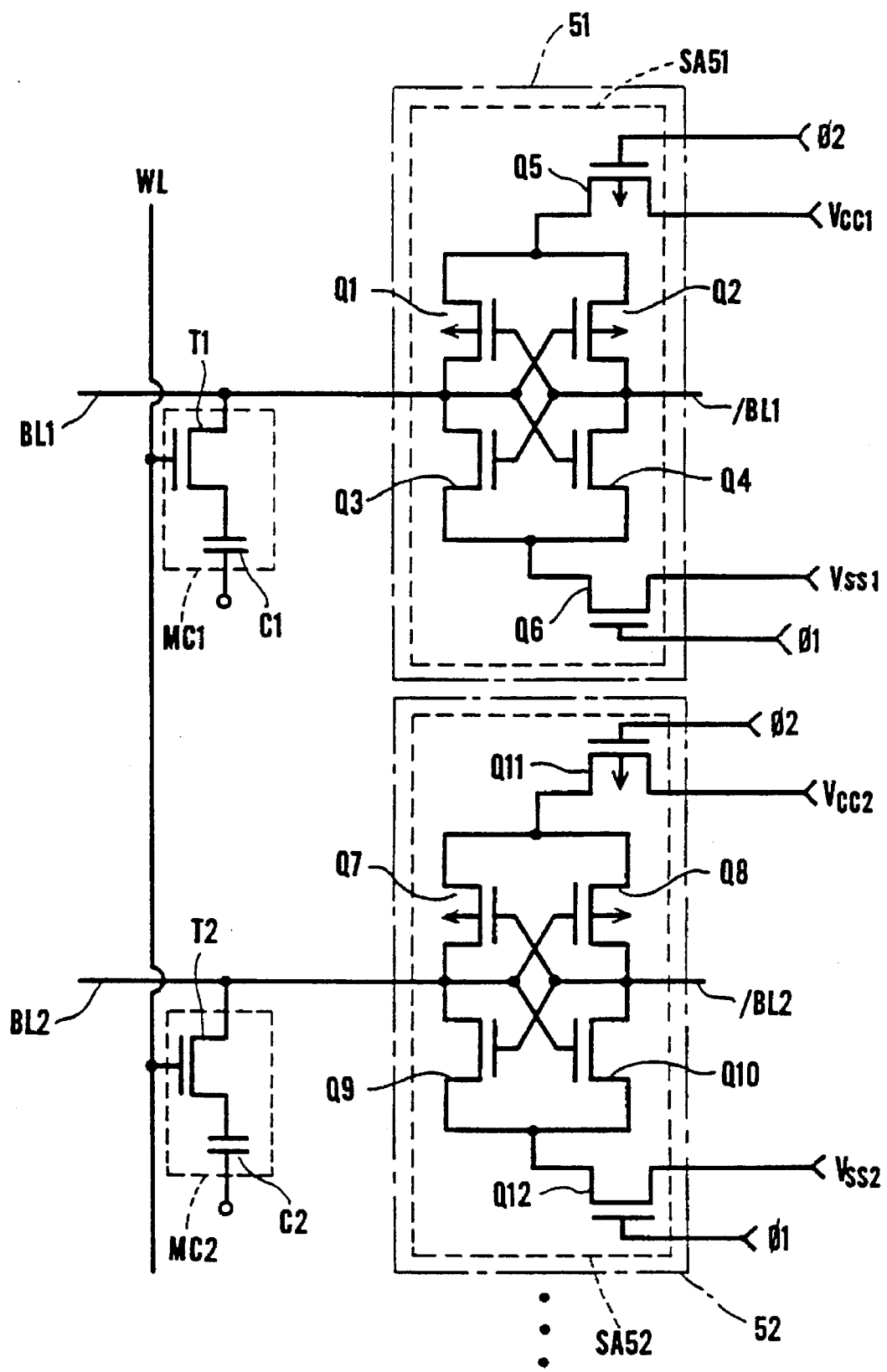
FIG. 10 is a circuit diagram showing the load circuit of FIG. 9.

Load circuits 51–54 of the semiconductor circuit of FIG. 9 will be described specifically. FIG. 10 is a circuit diagram of load circuits 51 and 52 of FIG. 9. In FIG. 10, components corresponding to those in FIGS. 1 and 18 have the same reference characters denoted.

Referring to FIG. 10, load circuit 51 is formed of a sense amplifier SA51 of a structure identical to that of sense amplifier SA1 shown in FIGS. 1 and 18. Load circuit 52 is formed of a sense amplifier SA52 of a structure identical to that of sense amplifier SA2 shown in FIGS. 1 and 18.

Sense amplifier SA51 of load circuit 51 is supplied with potential $V_{CC1}$ as the power supply potential and potential $V_{SS1}$ as the ground potential. Sense amplifier SA52 of load circuit 52 is supplied with potential $V_{CC2}$ as the power supply potential and potential $V_{SS2}$ as the ground potential. Sense amplifier SA51 is a low readout sense amplifier, and sense amplifier SA52 is a high readout sense amplifier. As mentioned before, a high readout sense amplifier is one type of a selected circuit, and a low readout sense amplifier is one type of a de-selected circuit.

The operation will be described. When sense amplifier SA52 which is a selected circuit operates, potential $V_{SS1}$ attempts to rise on account of the aforementioned interconnection resistance. In a sense amplifier SA51 which is a de-selected circuit, transistors Q3 and Q4 cannot be easily turned on if potential $V_{SS1}$ rises. Here, potential $V_{SS1}$ is reduced by the operation of differential amplifier 81 and transistor Q151 shown in FIG. 9, so that difficulty in transistors Q3 and Q4 attaining an on-level can be prevented.

Furthermore, an attempt to increase potential $V_{SS2}$ caused by the operation of sense amplifier SA52 per se is suppressed owing to the operations of differential amplifier 82 and transistor Q152.

Embodiment 5

Figure 11:
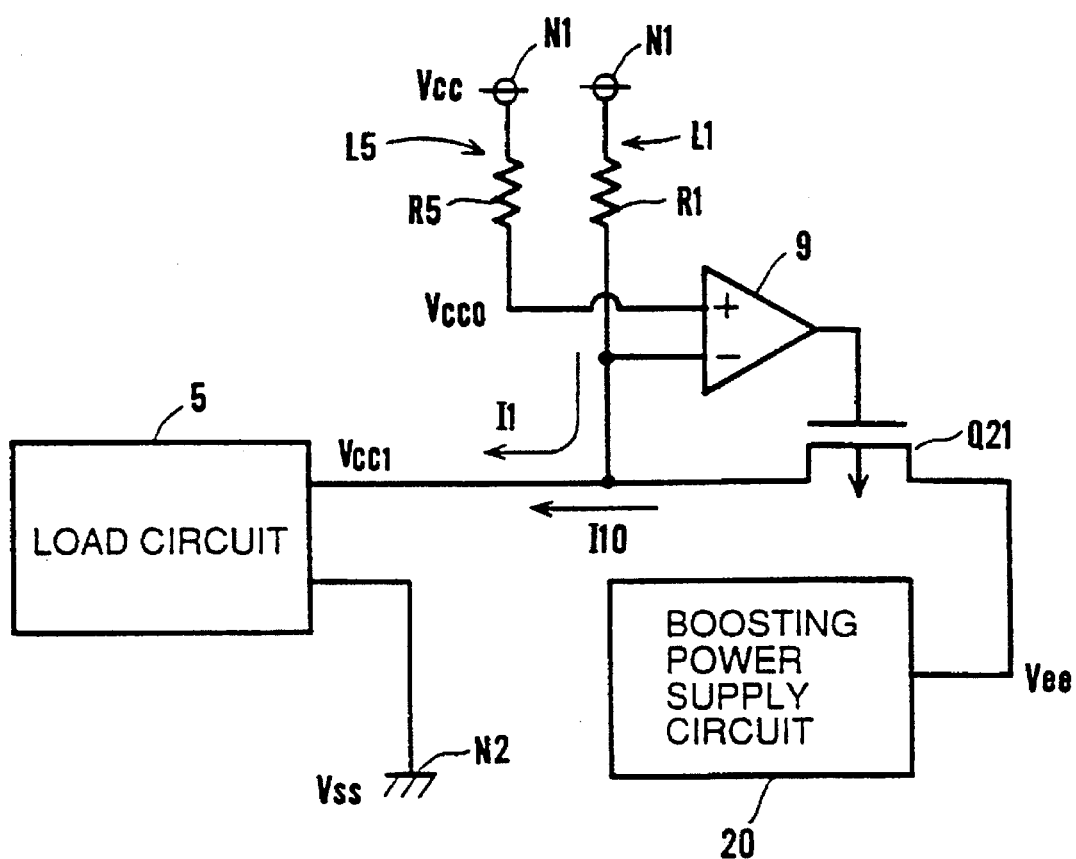
FIG. 11 is a circuit diagram of a semiconductor circuit according to a fifth embodiment.

A semiconductor circuit according to a fifth embodiment will be described with reference to the circuit diagram of FIG. 11. In FIG. 11, components corresponding to those in FIG. 17 have the same reference characters denoted.

Referring to FIG. 11, the semiconductor circuit of FIG. 11 differs from the semiconductor circuit of FIG. 17 in that a second power supply interconnection L5 is provided in addition to first power supply interconnection L1. Also, a differential amplifier 9, a PMOS transistor Q21 for switching, and a boosting power supply circuit 20 are provided.

Components of the semiconductor circuit of FIG. 11 differing from those of the semiconductor circuit of FIG. 17 will be described hereinafter.

Referring to FIG. 11, boosting power supply circuit 20 for generating boost potential $V_{PP}$ is connected to first power supply interconnection L1 via transistor Q21. Boosting power supply circuit 20 is similar to that shown in FIG. 2, for example. A negative input terminal of differential amplifier 9 is connected partway of first power supply interconnection L1. The positive input terminal of differential amplifier 9 is connected to one terminal of second power supply interconnection L5. An output terminal of differential amplifier 9 is connected to the gate of transistor Q21.

In a semiconductor circuit of the above-described structure, interconnection resistance R1 is present in first power supply interconnection L1, and interconnection resistance R5 is present in second power supply interconnection L5. There is a current path in first power supply interconnection L1. Potential $V_{CC1}$ output from first power supply interconnection L1 is reduced lower than power supply potential $V_{CC}$ by interconnection resistance R1. There is no current path in second power supply interconnection L5. Therefore, potential $V_{CC0}$ output from second power supply interconnection L5 is substantially equal to power supply potential $V_{CC}$.

Therefore, potential $V_{CC0}$ output from second power supply interconnection L5 is used as a reference potential in differential amplifier 9. Potential $V_{CC0}$ is referred to as reference potential $V_{CC0}$ hereinafter.

Figure 12:
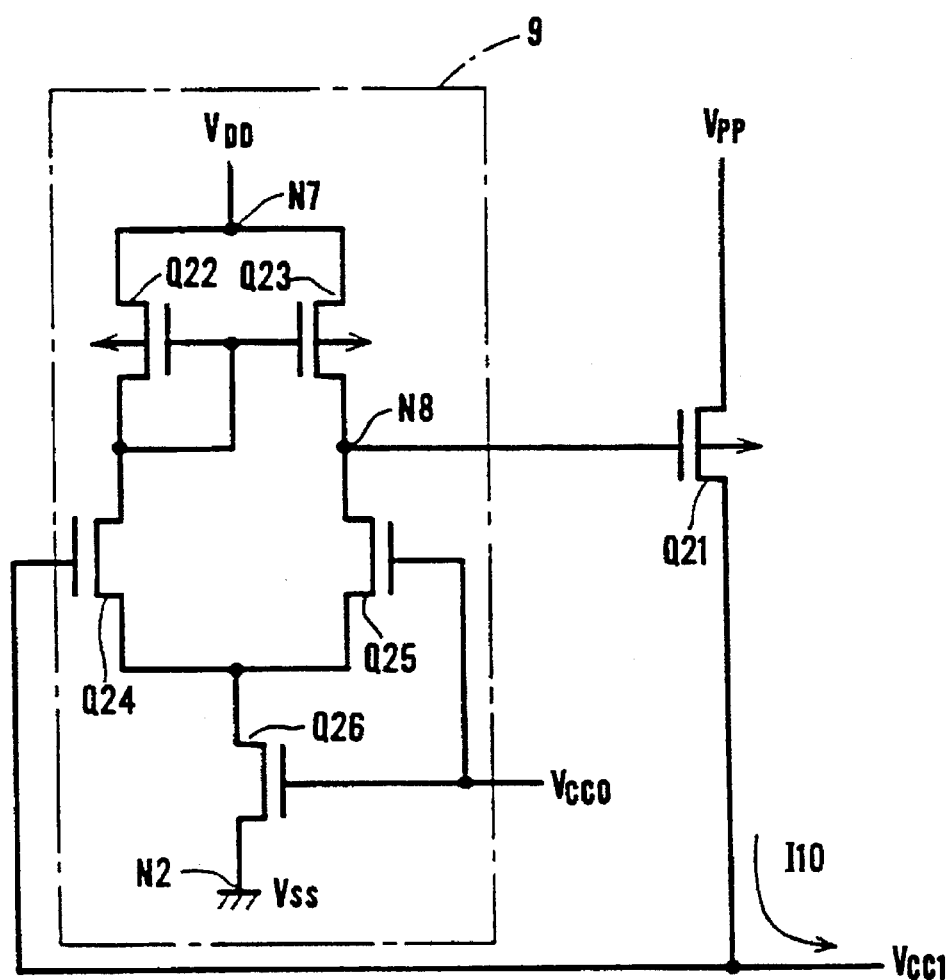
FIG. 12 is a circuit diagram showing in detail a differential amplifier of FIG. 11.

Differential amplifier 9 will be described with reference to FIG. 12. Differential amplifier 9 includes PMOS transistors Q22 and Q23, and NMOS transistors Q24, Q25 and Q26.

Transistors Q22, Q24 and Q26 are connected in series between node N7 receiving boost potential $V_{PP}$ and ground node N2. Transistors Q23 and Q25 are connected in series between node N7 and the node between transistors Q24 and Q26.

The respective gates of transistors Q25 and Q26 receive reference potential $V_{CC0}$. The gate of transistor Q24 receives potential $V_{CC1}$. Respective gates of transistors Q22 and Q23 are connected to the node between transistors Q22 and Q24. Node N8 between transistors Q23 and Q25 is connected to the gate of transistor Q21.

The operation of the semiconductor circuit of FIG. 11 will be described. Referring to FIG. 11, the potential provided from differential amplifier 9 to the gate of transistor Q21 is reduced when potential $V_{CC1}$ is lower than reference potential $V_{CC0}$. Referring to FIG. 12, transistor Q25 is biased more deeply than transistor Q24 to reduce the potential of node N8 when potential $V_{CC1}$ is lower than reference potential $V_{CC0}$ in differential amplifier 9. This causes the gate potential of transistor Q21 to be reduced.

When the gate potential of transistor Q21 becomes lower than the threshold voltage of transistor Q21, transistor Q21 is turned on. As a result, load current I10 flows from boost potential $V_{PP}$ towards potential $V_{CC1}$. Therefore, load current I10 flows from boosting power supply circuit 20 towards first power supply interconnection L1 as shown in FIG. 11.

The load current flowing towards load circuit 5 is divided into load current I1 and load current I10. Therefore, load current I1 is reduced. As a result, reduction of potential $V_{CC1}$ due to interconnection resistance R1 is suppressed. Here, load current I10 is increased/reduced according to variation of potential $V_{CC1}$, so that the variation width of potential $V_{CC1}$ due to variation in power supply potential $V_{CC}$ caused by noise is reduced.

Embodiment 6

Figure 13:
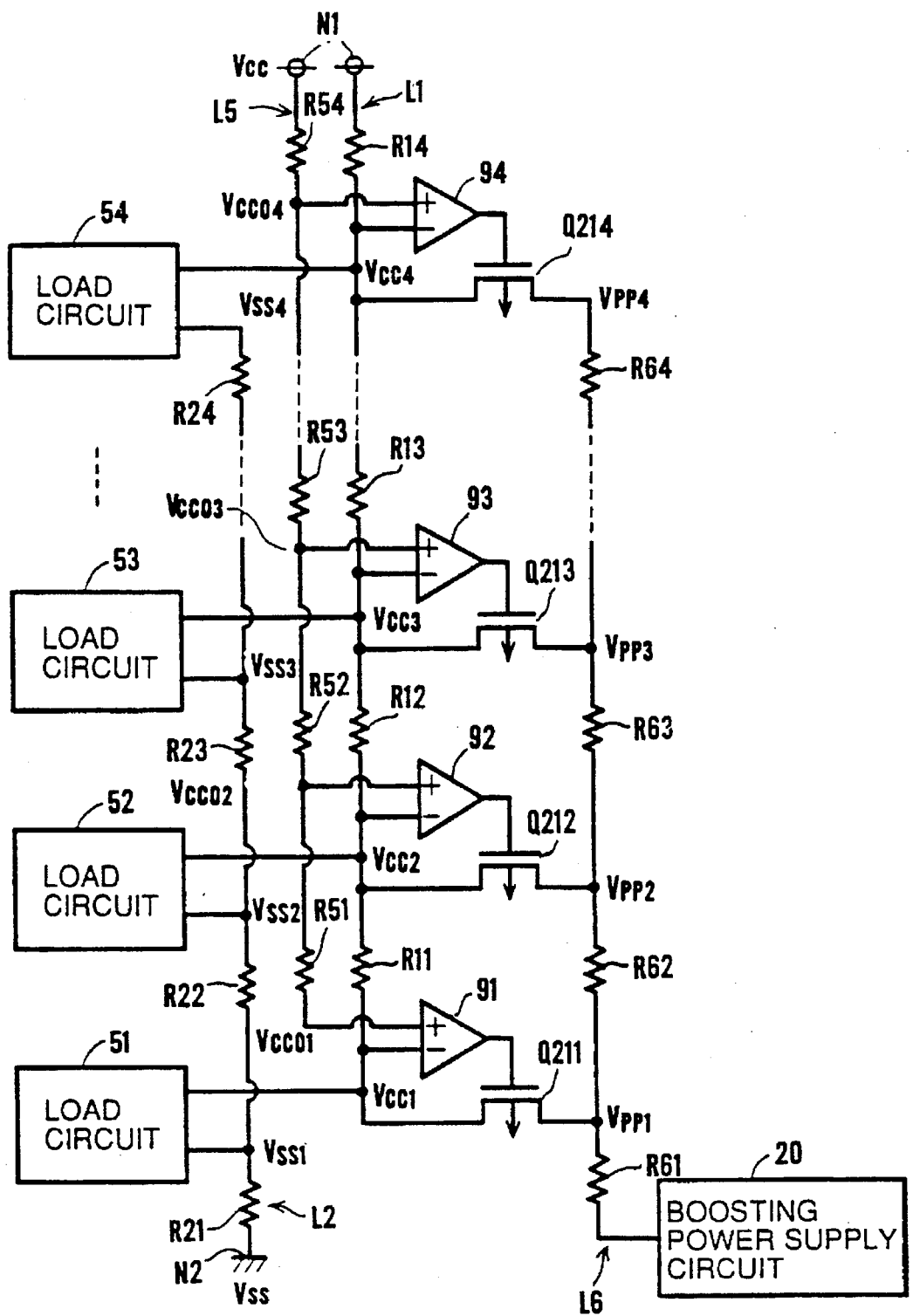
FIG. 13 is a circuit diagram of a semiconductor circuit according to a sixth embodiment.

A semiconductor circuit according to a sixth embodiment of the present invention will be described with reference to FIG. 13 showing a plurality of the semiconductor circuits of FIG. 11 connected to a common power source.

Each of load circuits 51–54 is connected to first power supply interconnection L1 and ground interconnection L2. In first power supply interconnection L1, there is an interconnection resistance R14 between the connection node of load circuit 54 and power supply node N1. There are also interconnection resistances R11–R13 between the respective connection nodes of load circuits 51–54 in first power supply interconnection L1.

Similarly, in ground interconnection L2, there is an interconnection resistance R21 between the connection node of load circuit 51 and ground node N2. There are also interconnection resistances R22–R24 between respective connection nodes of load circuits 51–54 in ground interconnection L2.

A second power supply interconnection L5 is provided in addition to first power supply interconnection L1. Differential amplifiers 91–94 have a function similar to that of differential amplifier 9 shown in FIG. 11. Transistors Q211–Q214 have a function similar to that of transistor Q21 shown in FIG. 11.

Differential amplifier 91 and transistor Q211 are provided corresponding to load circuit 51. Differential amplifier 92 and transistor Q212 are provided corresponding to load circuit 52. Differential amplifier 93 and transistor Q213 are provided corresponding to load circuit 53. Differential amplifier 94 and transistor Q214 are provided corresponding to load circuit 54. Boosting power supply circuit 20 is provided in common to load circuits 51–54.

Similar to first power supply interconnection L1, interconnection resistances R51–R54 exist in second power supply interconnection L5. However, there is no current path in second power supply interconnection L5. Therefore, reference potentials $V_{CC01}$–$V_{CC04}$ applied to differential amplifiers 91–94, respectively, are substantially equal to power supply potential $V_{CC}$.

There are also interconnection resistances R61–R64 in interconnection L6 between boosting power supply circuit 20 and respective transistors Q211–Q214. However, by setting the generation potential of boosting power supply circuit 20 so that potentials $V_{PP1}$–$V_{PP4}$ received by transistors Q211–Q214, respectively, are higher than power supply potential $V_{CC}$, reduction in potentials $V_{CC1}$–$V_{CC4}$ received by load circuits 51–54, respectively, can be suppressed due to the operation of differential amplifiers 91–94 and transistors Q211–Q214.

An operation of the semiconductor circuit of FIG. 13 will be described. Description is made on the assumption that load circuit 52 is a selected circuit, load circuit 51 is a de-selected circuit, and load circuit 51 does not operate when load circuit 52 is operating. When load circuit 52 operates, potential $V_{CC2}$ received by load circuit 52 is reduced due to interconnection resistances R12, R13 and R14. Therefore, potential $V_{CC1}$ received by load circuit 51 is also reduced.

Reduction in potential $V_{CC1}$ causes potential $V_{CC1}$ to rise due to operation of differential amplifier 91 and transistor Q211. Therefore, reduction in the potential of the de-selected circuit caused by operation of a selected circuit can be suppressed.

In load circuit 52 which is a selected circuit, differential amplifier 92 and transistor Q212 operate, whereby potential $V_{CC2}$ rises. Therefore, reduction in the potential of the selected circuit per se is suppressed.

A specific example of load circuits 51–54 in the semiconductor circuit of FIG. 13 is similar to the circuit shown in FIG. 10. Therefore, their description will not be repeated.

Embodiment 7

Figure 14:
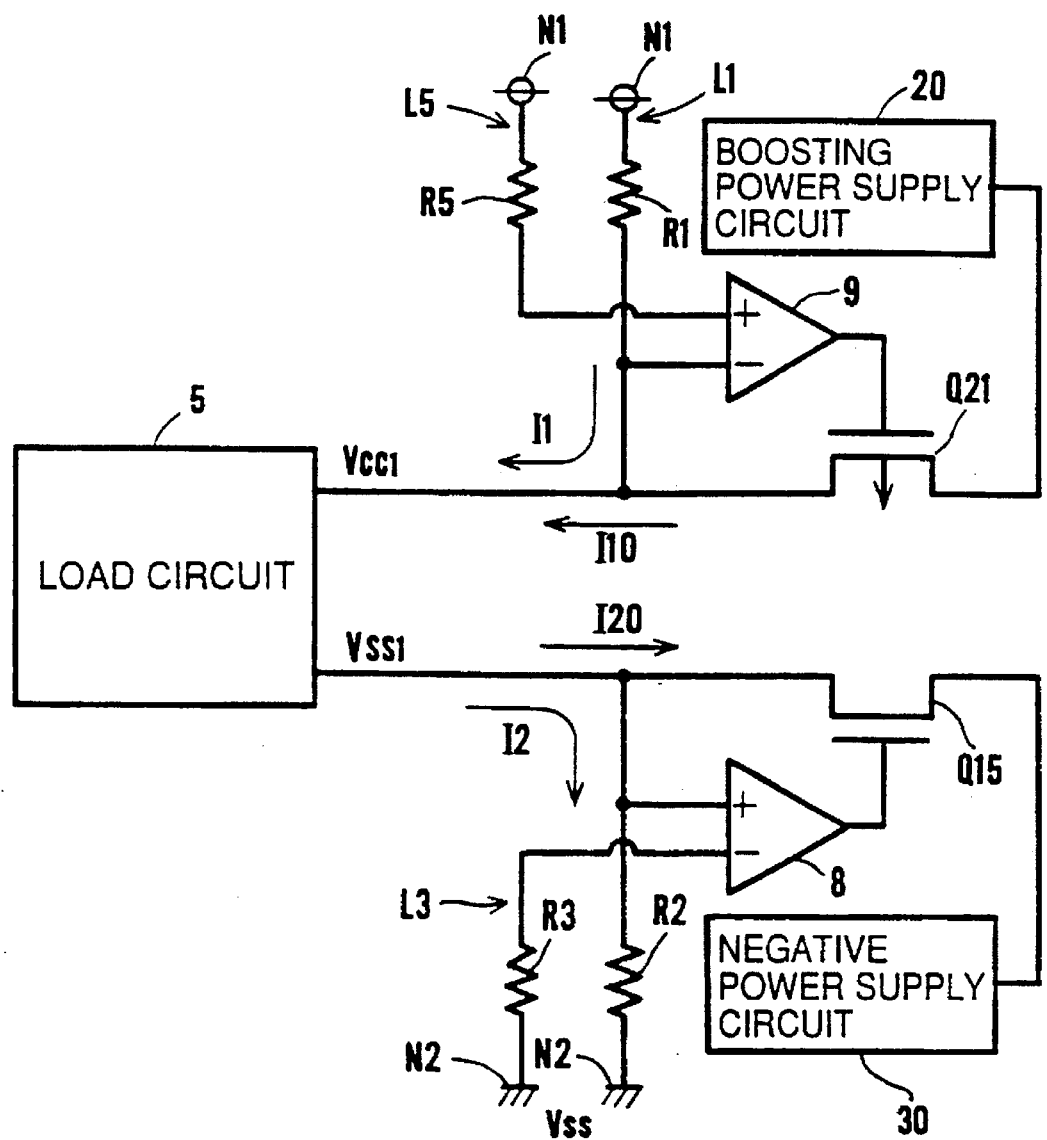
FIG. 14 is a circuit diagram of a semiconductor circuit according to a seventh embodiment.

A semiconductor circuit according to a seventh embodiment of the present invention will be described with reference to the circuit diagram of FIG. 14. In FIG. 14, components corresponding to those of FIG. 17 have the same reference characters denoted.

Referring to FIG. 14, the semiconductor circuit of FIG. 14 differs from the semiconductor circuit of FIG. 17 in that a second power supply interconnection L5, a second ground interconnection L3, differential amplifiers 8 and 9, transistors Q15 and Q21 for switching, a boosting power supply circuit 20, and a negative power supply circuit 30 are provided.

Differential amplifier 8, transistor Q15 and negative power supply circuit 30 are connected in a manner similar to those in the semiconductor circuit shown in FIG. 7, and carry out a similar operation. Differential amplifier 9, transistor Q21, and boosting power supply circuit 20 are connected in a manner similar to those in the semiconductor circuit of FIG. 11, and carry out a similar operation.

Therefore, in the semiconductor circuit of FIG. 14, reduction in the potential of $V_{CC1}$ due to interconnection resistance R1 and increase in the potential of $V_{SS1}$ due to interconnection resistance R2 can be suppressed.

The present invention is not limited to a sense amplifier as a specific example of load circuit 5 and load circuits 51–54 shown in FIG. 7, 9, 11, 13 and 14, and an input buffer (column address buffer) used in a semiconductor memory device can be enumerated as an example of load circuit 5 and load circuits 51–54. Alternatively, a simple inverter circuit may be used.

Figure 15:
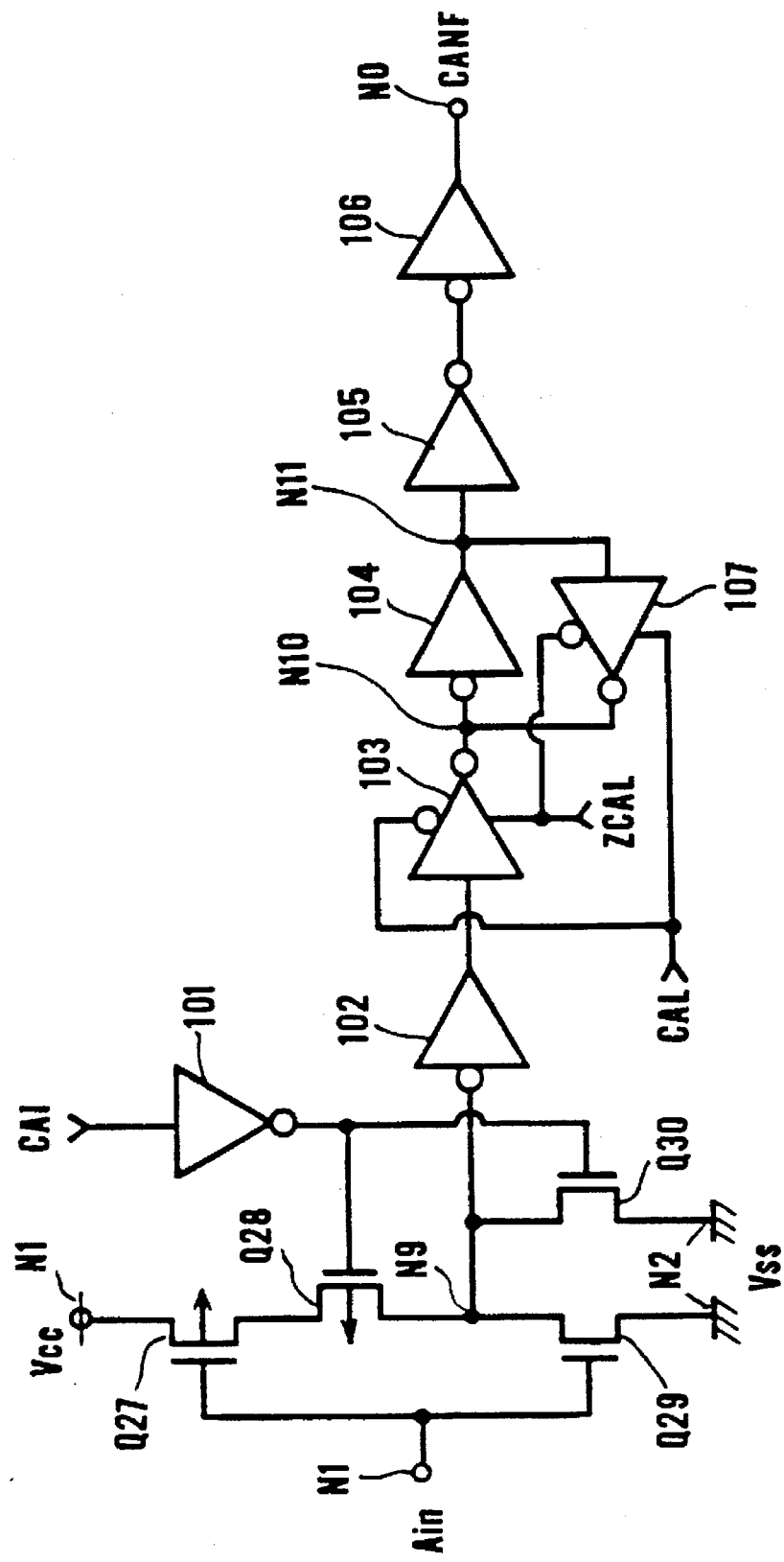
FIG. 15 is a circuit diagram of a column address buffer as an example of a load circuit.

FIG. 15 is a circuit diagram of a column address buffer as an example of a load circuit. Referring to FIG. 15, a column address buffer includes PMOS transistors Q27 and Q28, NMOS transistors Q29 and Q30, and inverters 101–107.

An input node NI receives an external input signal Ain. Transistors Q27, Q28 and Q29 are connected in series between a power supply node N1 and a ground node N2. A transistor Q30 is connected between a node N9 of transistors Q28 and Q29 and ground node N2. The gates of transistors Q27 and Q29 receive an external input signal Ain from input node NI. An internal signal CAI is applied to the respective gates of transistors Q28 and Q30 via inverter 101.

Inverters 102, 103, 104, 105 and 106 are connected in series between node N9 and output node NO. An inverter 107 is connected between a node N10 of inverters 103 and 104 and a node N11 of inverters 104 and 105. Inverter 107 has its input terminal connected to a node N11, and an output terminal connected to a node N10.

Internal signals ZCAL and CAL are provided to inverters 103 and 107, respectively. Each of inverters 101–107 is connected to power supply node N1 and ground node N2 to operate upon receiving power supply potential $V_{CC}$ and ground potential $V_{SS}$.

FIG. 16 is a timing chart of each signals in the column address buffer shown in FIG. 15. More specifically, the timing is shown of external input signal Ain, internal signal CAI, internal signal ZCAL, internal signal CAL and output signal CANF.

Referring to FIG. 16, external input signal Ain is an external address signal with $V_{IH}$ as a high level and $V_{IL}$ as a low level. The column address buffer receives external input signal Ain at input node NI to convert that external address into an output signal CANF which is an internal address. Output signal CANF is provided from output node NO.

In the above-described column address buffer, the logic threshold value $V_{TH}$ of the first stage of an NOR circuit determines the $V_{IH}/V_{IL}$. Therefore, there is a problem that a high level of an external input signal Ain approximating a low level is erroneously taken as a low level when ground potential $V_{SS}$ rises due to a noise or the like. There was also a problem that a low level of an external input signal Ain approximating a high level is erroneously determined as a high level when power supply potential $V_{CC}$ is reduced in a column address buffer.

It was therefore a necessary to stabilize power supply potential $V_{CC}$ and ground potential $V_{SS}$ in a column address buffer. The above-described problems inherent to a column address buffer can be solved in the case where the load circuits 5, 51–54 shown in FIGS. 7, 9, 11, 13 and 14 include a column address buffer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device comprising:
   a ground node for receiving a ground potential,
   a sense amplifier including a PMOS transistor and an NMOS transistor coupled to said ground node,
   negative power supply means for generating a negative potential lower than said ground potential,
   a switching NMOS transistor provided between said NMOS transistor of said sense amplifier and said negative power supply means, and
   one shot pulse generation means for applying a one shot pulse signal to a gate of said switching NMOS transistor.

2. A semiconductor circuit device, comprising:
   a sense amplifier including a PMOS transistor and an NMOS transistor,
   negative power supply means for generating a negative potential,
   a switching NMOS transistor provided between said NMOS transistor of said sense amplifier and said negative power supply means,
   one shot pulse generation means for applying a one shot pulse signal to a gate of said switching NMOS transistor,
   a ground node for receiving a ground potential,
   a second switching NMOS transistor provided between said NMOS transistor of said sense amplifier and said ground node, and
   control signal generation means for applying a control signal to a gate of said second switching NMOS transistor to turn said second switching NMOS transistor on after said one shot pulse signal is provided from said one shot pulse generation means.

* * * * *